(12) United States Patent
Iwatani et al.

(10) Patent No.: US 9,932,473 B2
(45) Date of Patent: Apr. 3, 2018

(54) ENCAPSULATING RESIN COMPOSITION, SEMICONDUCTOR DEVICE USING THE ENCAPSULATING RESIN COMPOSITION, AND METHOD FOR MANUFACTURING SEMICONDUCTOR DEVICE USING THE ENCAPSULATING RESIN COMPOSITION

(71) Applicant: Panasonic Intellectual Property Management Co., Ltd., Osaka (JP)

(72) Inventors: Emi Iwatani, Nara (JP); Kazuto Ogawa, Kyoto (JP); Kota Ishikawa, Mie (JP); Takayuki Tsuji, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/075,227

(22) Filed: Mar. 21, 2016

(65) Prior Publication Data
US 2016/0289443 A1    Oct. 6, 2016

Related U.S. Application Data

(63) Continuation of application No. PCT/JP2015/004659, filed on Sep. 14, 2015.

(30) Foreign Application Priority Data

Mar. 31, 2015    (JP) .................................. 2015-074239

(51) Int. Cl.
*C08L 63/00* (2006.01)
*C08J 3/00* (2006.01)
(Continued)

(52) U.S. Cl.
CPC ............ *C08L 63/00* (2013.01); *H01L 23/293* (2013.01); *H01L 23/295* (2013.01);
(Continued)

(58) Field of Classification Search
CPC ............... C08L 63/00; C08L 2203/206; C08L 2205/03; H01L 23/295; H01L 23/3114;
(Continued)

(56) References Cited

U.S. PATENT DOCUMENTS

2002/0151106 A1 * 10/2002 Noro ..................... C08F 283/10
438/118
2008/0265438 A1 * 10/2008 Asano ................. C08G 59/4215
257/778
(Continued)

FOREIGN PATENT DOCUMENTS

| JP | 8-003280 | 1/1996 |
| JP | 2013-112730 | 6/2013 |
| JP | 2014-114426 | 6/2014 |

OTHER PUBLICATIONS

International Search Report of PCT application No. PCT/JP2015/004659 dated Oct. 20, 2015.

*Primary Examiner* — David T Karst
(74) *Attorney, Agent, or Firm* — McDermott Will & Emery LLP

(57) ABSTRACT

An encapsulating resin composition contains a thermosetting resin component, a curing accelerator, an inorganic filler, an ion trapping agent, and an aromatic monocarboxylic acid having one or more electron-withdrawing functional groups selected from a nitro group and a cyano group. The encapsulating resin composition is solid at 25° C., and has a sulfur content, measured by X-ray fluorescence analysis, of 0.1 mass % or less in terms of $SO_3$.

18 Claims, 6 Drawing Sheets

(51) Int. Cl.
  *H01L 23/29* (2006.01)
  *H01L 23/31* (2006.01)
  *H01L 23/00* (2006.01)
  H01L 21/56 (2006.01)
  H01L 23/495 (2006.01)

(52) U.S. Cl.
  CPC .......... *H01L 23/3114* (2013.01); *H01L 24/48* (2013.01); *H01L 24/85* (2013.01); *C08L 2203/206* (2013.01); *C08L 2205/03* (2013.01); H01L 21/565 (2013.01); H01L 23/3107 (2013.01); H01L 23/49555 (2013.01); H01L 23/49582 (2013.01); H01L 2224/32245 (2013.01); H01L 2224/45139 (2013.01); H01L 2224/45144 (2013.01); H01L 2224/45147 (2013.01); H01L 2224/45565 (2013.01); H01L 2224/45664 (2013.01); H01L 2224/48247 (2013.01); H01L 2224/73265 (2013.01); H01L 2924/01016 (2013.01); H01L 2924/01028 (2013.01); H01L 2924/01046 (2013.01); H01L 2924/01047 (2013.01); H01L 2924/06 (2013.01); H01L 2924/066 (2013.01); H01L 2924/0665 (2013.01); H01L 2924/17738 (2013.01); H01L 2924/17763 (2013.01); H01L 2924/181 (2013.01)

(58) Field of Classification Search
  CPC ....... H01L 24/48; H01L 24/85; H01L 23/293; H01L 21/565; H01L 23/49582; H01L 2224/45139; H01L 2224/45147; H01L 2224/48247; H01L 2924/01016; H01L 2924/01028; H01L 2924/01046; H01L 2924/06; H01L 2924/066; H01L 2924/0665; H01L 2924/17738; H01L 2924/17763; H01L 23/3107; H01L 23/49555; H01L 2224/45664; H01L 2224/45144; H01L 2924/181; H01L 2224/45565; H01L 2224/32245; H01L 2224/3265
  USPC ....................................................... 523/400
  See application file for complete search history.

(56) References Cited

U.S. PATENT DOCUMENTS

2009/0247670 A1\* 10/2009 Hamada ............... C08G 59/621
                                                            523/450
2012/0101191 A1\*  4/2012 Enomoto ............. H01L 23/295
                                                            523/466
2013/0137218 A1    5/2013 Morita et al.

\* cited by examiner

ENCAPSULATING RESIN COMPOSITION, SEMICONDUCTOR DEVICE USING THE ENCAPSULATING RESIN COMPOSITION, AND METHOD FOR MANUFACTURING SEMICONDUCTOR DEVICE USING THE ENCAPSULATING RESIN COMPOSITION

BACKGROUND

1. Technical Field

The present disclosure relates to an encapsulating resin composition, a semiconductor device using the encapsulating resin composition, a method for manufacturing a semiconductor device by using the encapsulating resin composition. In more detail, the present disclosure relates to a resin composition suitable for a semiconductor device using copper (Cu) wire or silver (Ag) wire, a semiconductor device, and a method for manufacturing the semiconductor device.

2. Background Art

Conventionally, in the field of encapsulation technology of semiconductor elements such as transistors and integrated circuits (IC), resin encapsulation is mainstream from the viewpoint of productivity, cost, or the like. Commercially available semiconductor devices include a lead frame and a semiconductor element, which are resin-encapsulated by using an encapsulating resin composition as encapsulation resin, essentially including epoxy resin, a phenol resin-base curing agent, a curing accelerator, and an inorganic filler. The encapsulation resin is required to have adhesion to the lead frame, the semiconductor device, and the like.

SUMMARY

An encapsulating resin composition of one aspect of the present disclosure contains a thermosetting resin component, a curing accelerator, an inorganic filler, an ion trapping agent, and an aromatic monocarboxylic acid having one or more electron-withdrawing functional groups selected from a nitro group and a cyano group. The encapsulating resin composition is solid at 25° C., and has a sulfur content, measured by X-ray fluorescence analysis, of 0.1 mass % or less in terms of $SO_3$.

A semiconductor device of one aspect of the present disclosure includes a lead frame, a semiconductor element mounted on the lead frame, a wire electrically connecting the semiconductor element to the lead frame, and an encapsulation resin encapsulating the semiconductor element. The above-mentioned encapsulation resin is a cured product of the encapsulating resin composition described above.

A method for manufacturing a semiconductor device of one aspect of the present disclosure includes a step of molding the encapsulating resin composition by a pressure-molding process so as to produce encapsulation resin.

The encapsulating resin composition of the present disclosure does not cause a large problem in the reliability of copper or silver wire because the encapsulating resin does not contain an additive agent including sulfur (S) as an atom. Furthermore, the encapsulation resin made from the encapsulating resin composition has excellent adhesion to the lead frame, and is excellent in high-temperature standing property, moisture-resistance reliability, or the like.

DETAILED DESCRIPTION OF PREFERRED EMBODIMENTS

Prior to the exemplary embodiment of the present disclosure, problems of conventional technology are briefly described. A recent price rise of gold has brought about a clear trend toward change from conventional gold wire to low-price copper or silver wire. However, when additive agents including a S atom are used, copper wire and silver wire may be sulfurized and corroded, and consequently exhibit poor results in tests of adhesion strength and high-temperature standing reliability. Composition of encapsulation resin without including S atom may be possible, but in such a composition, initial bonding strength is deteriorated and exfoliation occurs in evaluation of moisture-resistance reliability or the like.

In order to improve adhesion between encapsulation resin and a plated-lead frame, Japanese Patent Application Unexamined Publication No. 2014-114426 proposes a resin composition containing aromatic polycarboxylic acid having one nitro group in a molecule. However, in the resin composition, gel time in heating becomes longer, making it impossible to meet recent demand for improvement in productivity.

Figure 1:
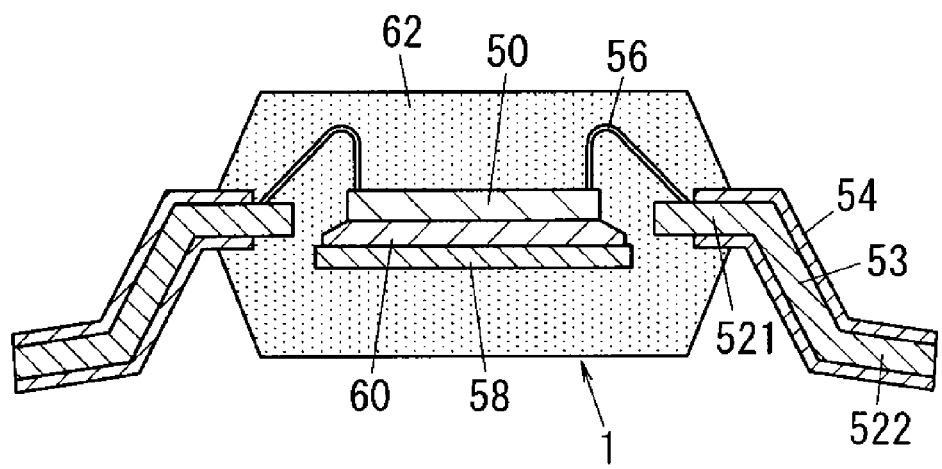
FIG. 1 is a sectional view of a semiconductor device in accordance with an exemplary embodiment of the present disclosure.

Hereinafter, the exemplary embodiment of the present disclosure is described in detail. FIG. 1 is a sectional view of semiconductor device 1 in accordance with this exemplary embodiment. Semiconductor device 1 includes lead frame 53, semiconductor element 50 mounted on lead frame 53, wire 56 electrically connecting semiconductor element 50 to lead frame 53, and encapsulation resin 62 encapsulating semiconductor element 50. Lead frame 53 is silver-plated, and has plated layer 54 on the surface thereof. Encapsulation resin 62 is a cured product of an encapsulating resin composition of this exemplary embodiment mentioned below. The encapsulating resin composition of this exemplary embodiment is useful for semiconductor device 1 using thus silver-plated lead frame 53, and copper wire or silver wire as wire 56. Use of the encapsulating resin composition of this exemplary embodiment enhances adhesion between encapsulation resin 62 and lead frame 53 and between encapsulation resin 62 and wire 56 such as copper wire and silver wire, and improves high-temperature standing property, moisture-resistance reliability, or the like, of semiconductor device 1.

The encapsulating resin composition in accordance with this exemplary embodiment contains a thermosetting resin component, a curing accelerator, an inorganic filler, an ion trapping agent, and an aromatic monocarboxylic acid having one or more electron-withdrawing functional groups selected from a nitro group and a cyano group (hereinafter, referred to as "substituted aromatic monocarboxylic acid"). The encapsulating resin composition is solid at 25° C. A sulfur content in the encapsulating resin composition, measured by X-ray fluorescence analysis, is 0.1 mass % or less in terms of $SO_3$.

The above-mentioned substituted aromatic monocarboxylic acid has at least one carboxyl group, and an electron-withdrawing functional group that does not include sulfur and halogen. That is to say, the aromatic monocarboxylic acid in this exemplary embodiment is a cyclic compound in which a carboxyl group and the above-mentioned electron-withdrawing functional group are bonded to a benzene ring, a naphthalene ring, or the like. A sulfur element or a halogen element corrodes silver wire, a silver-plated portion, or the like. The electron-withdrawing functional group in the aromatic monocarboxylic acid is free from sulfur or halogen element.

The encapsulating resin composition of this exemplary embodiment includes no or small content of a sulfur compound. Consequently, in FIG. 1, even when wire 56 includes at least one of silver and copper, wire 56 is not easily corroded even at high temperature.

The encapsulating resin composition of this exemplary embodiment contains no or small content of a sulfur compound, and it contains substituted aromatic monocarboxylic acid. In FIG. 1, since encapsulation resin 62 formed from an encapsulation resin composition of this exemplary embodiment contains substituted aromatic monocarboxylic acid, it has high adhesion to lead frame 53 including plated layer 54. Since the encapsulating resin composition of this exemplary embodiment contains substituted aromatic monocarboxylic acid, lengthening of gel time does not easily occur according to the improvement of the adhesion. The encapsulating resin composition of this exemplary embodiment shortens the gel time, so that it shortens a molding cycle of a semiconductor device or the like.

Composition of an encapsulating resin composition in accordance with the exemplary embodiment is described in more detail.

Substituted aromatic monocarboxylic acid particularly includes an aromatic ring, one carboxyl group bonded to the aromatic ring, and at least one electron-withdrawing functional group bonded to the aromatic ring. In particular, the aromatic ring is preferably a benzene ring or a naphthalene ring.

The substituted aromatic monocarboxylic acid does not include a halogen atom and a sulfur atom. In this case, corrosion of wire 56 made of silver or copper, which may be caused by the substituted aromatic monocarboxylic acid, is suppressed.

The electron-withdrawing functional group is selected from a nitro group and a cyano group. The substituted aromatic monocarboxylic acid may include one electron-withdrawing functional group, and may include a plurality of electron-withdrawing functional groups.

The substituted aromatic monocarboxylic acid is represented by, for example, the following chemical formula (1).

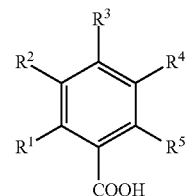

(1)

In the formula, one of $R^1$ to $R^5$ is an electron-withdrawing functional group, and the remaining four of $R^1$ to $R^5$ are each independently H, an organic group, or an electron-withdrawing functional group. As the organic group, a group that does not affect the property of the substituted aromatic monocarboxylic acid is selected. The organic group is preferably an alkyl group, an alkenyl group, or an alkoxy group, and particularly preferably $CH_3$. It is particularly preferable that one of $R^1$ to $R^5$ is an electron-withdrawing functional group and the remaining four of $R^1$ to $R^5$ are each independently H or an organic group.

The substituted aromatic monocarboxylic acid particularly includes nitrobenzoic acid. Furthermore, the substituted aromatic monocarboxylic acid preferably includes at least one selected from the group consisting of 2-nitrobenzoic acid, 3-nitrobenzoic acid, 4-nitrobenzoic acid, 3-methyl-4-nitrobenzoic acid, 2-methyl-3-nitrobenzoic acid, 4-methyl-3-nitrobenzoic acid, 2-methyl-6-nitrobenzoic acid, 3-methyl-2-nitrobenzoic acid, 2-methyl-5-nitrobenzoic acid, 5-methyl-2-nitrobenzoic acid, 2-cyanobenzoic acid, 3-cyanobenzoic acid, 4-cyanobenzoic acid, 4-hydroxy-3-nitrobenzoic acid, 5-hydroxy-2-nitrobenzoic acid, 3-hydroxy-4-nitrobenzoic acid, 3-hydroxy-2-nitrobenzoic acid, 2-hydroxy-4-nitrobenzoic acid, and 2-hydroxy-5-nitrobenzoic acid.

The melting point of substituted aromatic monocarboxylic acid is preferably 200° C. or less. Use of substituted aromatic monocarboxylic acid having a melting point of 200° C. or less allows temperatures for heating, melting, and mixing constituting components in a process for manufacturing the encapsulating resin composition to be lowered, resulting in stabilizing the quality of the encapsulating resin composition. In the encapsulating resin composition of this exemplary embodiment, in a case where the substituted aromatic monocarboxylic acid includes nitrobenzoic acid, it is preferable that the nitrobenzoic acid includes only at least one of 2-nitrobenzoic acid and 3-nitrobenzoic acid. The substituted aromatic monocarboxylic acid may include 4-nitrobenzoic acid having a melting point higher than 200° C. In this case, however, in order to sufficiently mix the constituting components, types and blending amounts of the components other than 4-nitrobenzoic acid in the constituting components are restricted.

Since the encapsulating resin composition of this exemplary embodiment contains the substituted aromatic monocarboxylic acid, in FIG. 1, encapsulation resin 62 made of the encapsulating resin composition can highly adhere to lead frame 53 having plated layer 54. When semiconductor device 1 shown in FIG. 1 is produced by using the encapsulating resin composition of this exemplary embodiment, encapsulation resin 62 made of a cured product of the encapsulating resin composition can highly adhere to lead frame 53, plated layer 54, and wire 56. It is assumed that the high adhesion between encapsulation resin 62, and plated layer 54 and wire 56 in semiconductor device 1 shown in FIG. 1 is achieved by the following mechanism.

Figure 2:
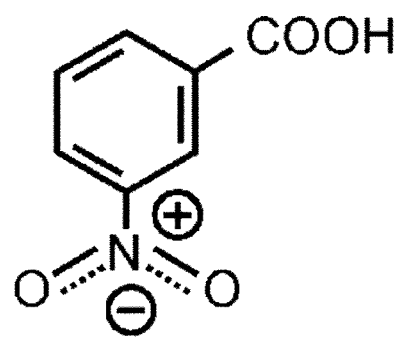
FIG. 2 shows a molecular structure of 3-nitrobenzoic acid.
Figure 3:
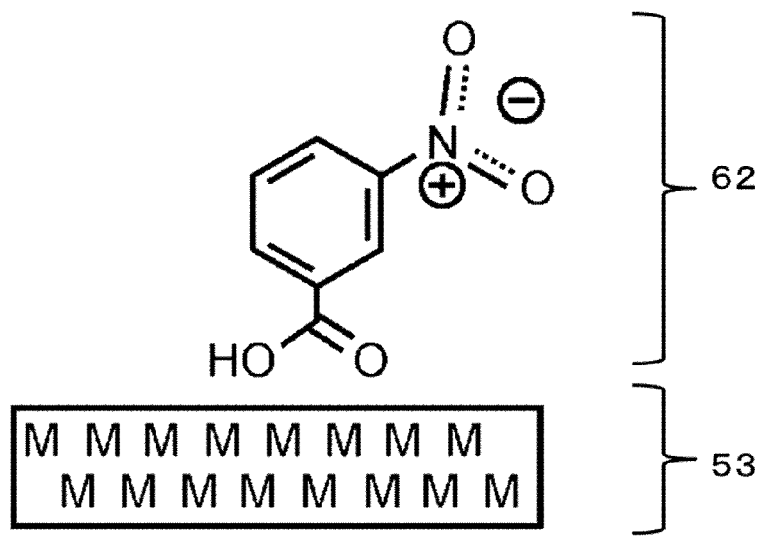
FIG. 3 is a schematic illustration showing the molecular structure of 3-nitrobenzoic acid when approaching a metal surface.
Figure 4:
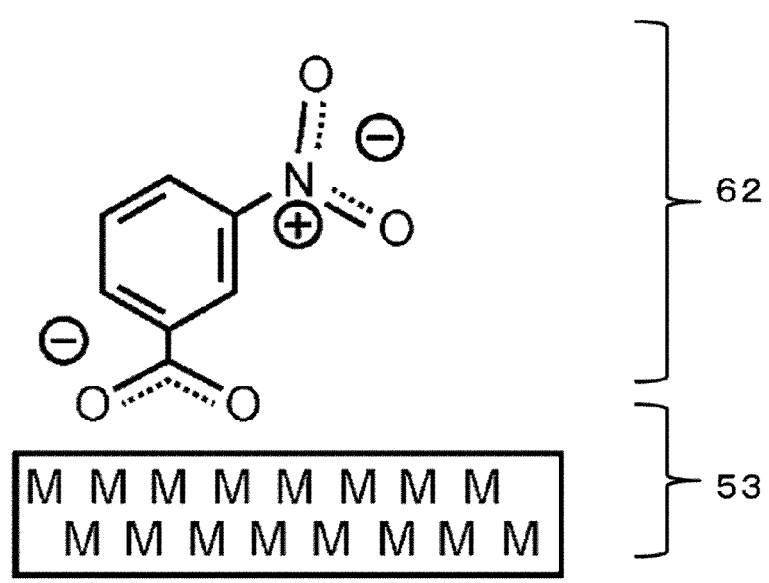
FIG. 4 is a schematic illustration showing the molecular structure of 3-nitrobenzoic acid when 3-nitrobenzoic acid is bonded to the metal surface.

With reference to FIGS. 2 to 4, high adhesion of the encapsulating resin composition in accordance with this exemplary embodiment is described.

The encapsulating resin composition of this exemplary embodiment includes an substituted aromatic monocarboxylic acid. As shown in FIG. 2, an electron-withdrawing functional group of the substituted aromatic monocarboxylic acid attracts an electron of an aromatic ring of the substituted aromatic monocarboxylic acid. FIG. 3 shows a mechanism in which the substituted aromatic monocarboxylic acid expresses high adhesion between encapsulation resin 62 and lead frame 53, plated layer 54, and wire 56 in semiconductor device 1 shown in FIG. 1. M in FIGS. 3 and 4 represents a metal part, and corresponds to lead frame 53, plated layer 54, and wire 56 shown in FIG. 1. Encapsulation resin 62 shown in FIGS. 3 and 4 is formed by curing the encapsulating resin composition of this exemplary embodiment, and corresponds to encapsulation resin 62 shown in FIG. 1.

As shown in FIG. 2, the electron-withdrawing functional group attracts an electron of the aromatic ring, so that a proton is eliminated from a carboxyl group, and a carboxylic acid anion is generated.

FIG. 3 shows a state in which the electron-withdrawing functional group of the substituted aromatic monocarboxylic acid included in the encapsulating resin composition adsorbs to the surface of metal part M including silver or copper (the metal part M corresponds to lead frame 53 and the like shown in FIG. 1). The encapsulating resin composition is brought into contact with metal part M, and the substituted aromatic monocarboxylic acid included in the encapsulating resin composition approaches metal part M (shown as lead frame 53 in FIG. 2). In other words, the encapsulating resin composition is heated, the substituted aromatic monocarboxylic acid included in the encapsulating resin composition moves to an interface part (or a contact part) between the encapsulating resin composition and the metal part M. Then, the moving substituted aromatic monocarboxylic acid adsorbs to the interface (or the contact surface) of metal part M. Further, a proton is eliminated from a carboxyl group of the substituted aromatic monocarboxylic acid, and a carboxylic acid anion is generated. Then, the carboxylic acid anion is bonded to a metal component constituting metal part M to form a salt. Encapsulation resin 62 shown in FIG. 3 is a cured product of the encapsulating resin composition including the substituted aromatic monocarboxylic acid.

As shown in FIGS. 3 and 4, substituted aromatic monocarboxylic acid bonded to metal components constituting metal part M corresponding to lead frame 53 is disposed on the interface between encapsulation resin 62 and lead frame 53. The surface of lead frame 53 is covered with a coating film made of the substituted aromatic monocarboxylic acid or a metal salt thereof. The substituted aromatic monocarboxylic acid (or a metal salt thereof) covering the surface of lead frame 53 has an aromatic ring, and, therefore, has high affinity with organic substances included in encapsulation resin 62. For this reason, encapsulation resin 62 highly adheres to lead frame 53. FIGS. 3 and 4 do not show the thermosetting resin component, the inorganic filler, and the like, included in encapsulation resin 62.

Figure 5:
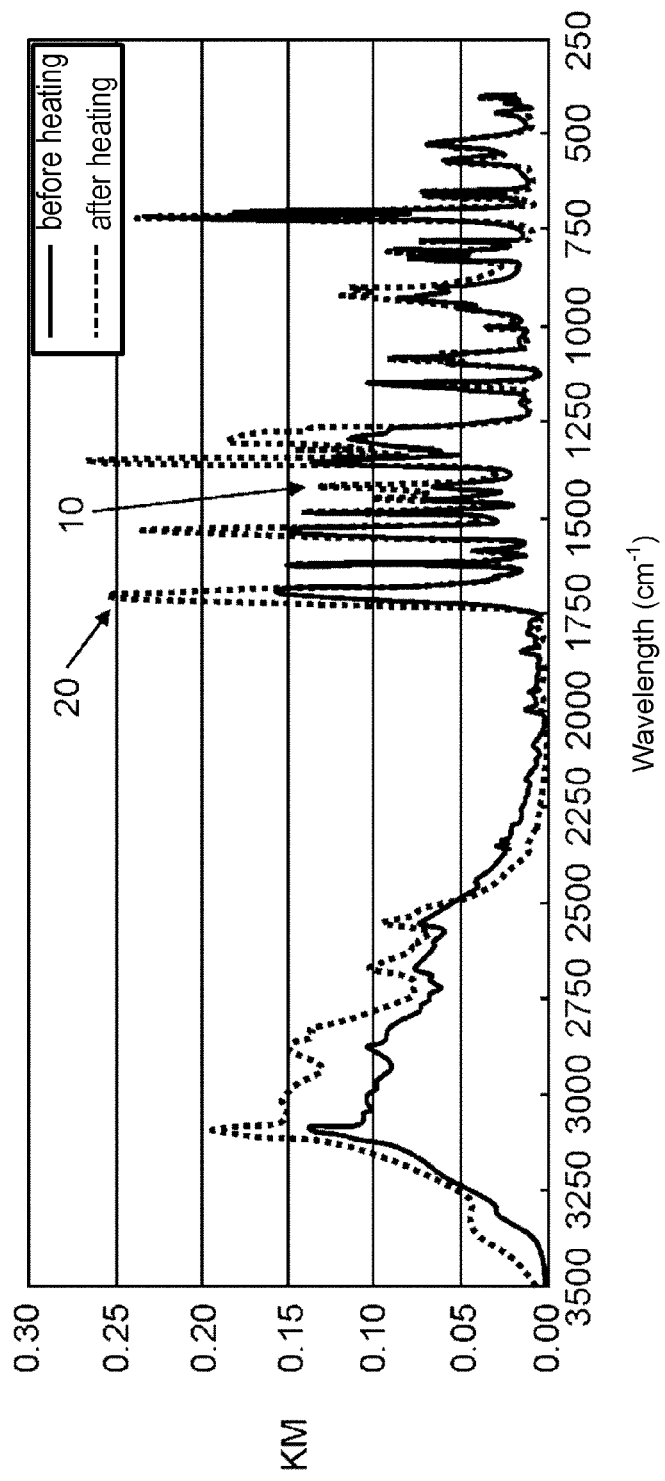
FIG. 5 is a graph showing Fourier transform infrared spectroscopy (FT-IR) spectrum measured in an analysis of reaction between 3-nitrobenzoic acid and silver.

In order to demonstrate the assumption described in FIGS. 2 to 4, the present inventors have carried out the following experiment. An effect of addition of the substituted aromatic monocarboxylic acid in the encapsulating resin composition is supported by the experiment by the present inventors. The present inventors select 3-nitrobenzoic acid as one example of the substituted aromatic monocarboxylic acid, mix 3-nitrobenzoic acid and silver powder together to obtain a mixture, and drop the mixture onto a plate made of silver. The mixture on the plate is heated at 175° C. for 30 seconds. The mixture before heating and the mixture after heating are analyzed by the diffuse reflectance infrared Fourier transform spectrometry. The measurement results are shown as charts in FIG. 5. In FIG. 5, a solid line is a chart before heating, and a dashed line is a chart after heating, respectively. In the chart after heating, as compared with the chart before heating, strength of a peak derived from carboxylic acid represented by reference numeral 10 is increased, and a peak derived from a carbonyl framework represented by reference numeral 20 is shifted to the high wavenumber side. The results show that after heating, salt of carboxylic acid is increased. That is to say, by heating, the substituted aromatic monocarboxylic acid is bonded to the plate made of silver, and a salt of carboxylic acid is generated.

In FIG. 1, in order to achieve high adhesion between encapsulation resin 62 and lead frame 53, it is preferable that the substituted aromatic monocarboxylic acid has low pKa. Specifically, pKa (acid dissociation constant) of the substituted aromatic monocarboxylic acid is preferably 4 or less. When the acid dissociation constant, pKa, is 4 or less, the carboxyl group in the substituted aromatic monocarboxylic acid easily becomes anion, and forms a salt with a metal component constituting lead frame 53 as shown in FIGS. 3 and 4. It is particularly preferable that pKa of the substituted aromatic monocarboxylic acid included in the encapsulating resin composition of this exemplary embodiment is 4 or less.

The above-mentioned reasoning is based on the analysis carried out by the present inventors in the case where the substituted aromatic monocarboxylic acid includes a nitro group. However, the same reasoning is applied to a case where the substituted aromatic monocarboxylic acid includes a cyano group.

It is necessary that the reactivity is low between the thermosetting resin component and the electron-withdrawing functional group in the substituted aromatic monocarboxylic acid included in the encapsulating resin composition of this exemplary embodiment. When the reactivity is low, reaction and fixation of the substituted aromatic monocarboxylic acid to the thermosetting resin component are suppressed when the encapsulating resin composition is heated so as to form encapsulation resin 62. When the reaction between the substituted aromatic monocarboxylic acid and the thermosetting resin component is suppressed, it is possible to obtain an excellent effect that the substituted aromatic monocarboxylic acid forms a salt together with metal constituting lead frame 53. In the encapsulating resin composition of this exemplary embodiment, combination of a thermosetting resin component and an electron attractive substituent is selected in order to lower the reactivity between the thermosetting resin component and the electron-attractive substituent.

This exemplary embodiment can achieve an excellent effect that gel time of the encapsulating resin composition is shortened although substituted aromatic monocarboxylic acid is contained. This excellent effect is achieved because the substituted aromatic monocarboxylic acid has only one carboxyl group, and, therefore, an amount of protons released from the substituted aromatic monocarboxylic acid is not too excessive. The following is more detailed description thereof. Protons deactivate a basic curing accelerator in the encapsulating resin composition, thus causing lengthening of gel time. In the case of this exemplary embodiment, however, since the substituted aromatic monocarboxylic acid includes only one carboxyl group, an amount of protons released from the substituted aromatic monocarboxylic acid is not large. Therefore, in the case of this exemplary embodiment, deactivation of the curing accelerator due to protons is suppressed, and the gel time is shortened. On the other hand, in the case of aromatic polycarboxylic acid having a plurality of carboxyl groups, an amount of protons released from the aromatic polycarboxylic acid becomes so excessive that the gel time of the encapsulating resin composition becomes longer.

In this exemplary embodiment, in order to suppress the deactivation of the curing accelerator due to protons, it is preferable that the encapsulating resin composition does not contain the other carboxylic acid other than the substituted aromatic monocarboxylic acid (for example, aromatic polycarboxylic acid having an electron-withdrawing functional group). When the encapsulating resin composition contains the other carboxylic acid other than the substituted aromatic monocarboxylic acid, the content of the other carboxylic acid is suppressed to 0.3 mass % or less with respect to the whole encapsulating resin composition.

In the case of this exemplary embodiment, the content of the substituted aromatic monocarboxylic acid is preferably in the range from 0.001 to 0.6 mass %, inclusive, with respect to the whole amount of the encapsulating resin composition. When the content of the substituted aromatic monocarboxylic acid is 0.001 mass % or more, the adhesion between encapsulation resin 62 and lead frame 53 is particularly increased. When the content of the substituted aromatic monocarboxylic acid is in a range from 0.01 mass % to 0.5 mass %, inclusive, it is possible to achieve an excellent effect that the deactivation of the curing accelerator due to protons is particularly suppressed and the lengthening of the gel time is suppressed.

The components other than the substituted aromatic monocarboxylic acid in the encapsulating resin composition of this exemplary embodiment are described.

The thermosetting resin component in the encapsulating resin composition of this exemplary embodiment is a thermosetting resin, or a thermosetting resin and a curing agent.

The thermosetting resin includes at least one component selected from the group consisting of epoxy resin, cyanate ester resin, benzoxazine resin, and maleimide resin. The thermosetting resin contains epoxy resin, for example.

The thermosetting resin may contain epoxy resin and benzoxazine resin. In this case, since benzoxazine resin can react with epoxy resin, benzoxazine resin may be used also as the curing agent.

The molecular weights or the molecular structures of the components included in the thermosetting resin are not particularly limited. Therefore, in a case where the thermosetting resin contains epoxy resin, the epoxy resin may include any of a monomer, an oligomer, and a polymer, as long as the epoxy resin has not less than two epoxy groups.

The epoxy resin contains at least one component selected from the group consisting of, for example, glycidyl ether-type epoxy resin, glycidyl amine-type epoxy resin, glycidyl ester-type epoxy resin, and olefin oxidation type (alicyclic) epoxy resin. More specifically, the epoxy resin contains at least one component selected from the group consisting of, for example, alkyl phenol novolac-type epoxy resin such as phenol novolac-type epoxy resin and cresol novolac-type epoxy resin; naphthol novolac-type epoxy resin; phenol aralkyl-type epoxy resin having a phenylene framework, a biphenylene framework, or the like; biphenyl aralkyl-type epoxy resin; naphthol aralkyl-type epoxy resin having a phenylene framework, a biphenylene framework, or the like; polyfunctional-type epoxy resin such as triphenol methane-type epoxy resin and alkyl-modified triphenol methane-type epoxy resin; triphenyl methane-type epoxy resin; tetrakis phenol ethane-type epoxy resin; dicyclopentadiene-type epoxy resin; stilbene-type epoxy resin; bisphenol-type epoxy resin such as bisphenol-A-type epoxy resin and bisphenol-F-type epoxy resin; biphenyl-type epoxy resin; naphthalene-type epoxy resin; alicyclic epoxy resin; bromine-containing epoxy resin such as bisphenol-A-type bromine-containing epoxy resin; glycidyl amine-type epoxy resin obtained by a reaction between epichlorohydrin and polyamine such as diamino diphenyl methane and isocyanuric acid; and glycidyl ester-type epoxy resin obtained by a reaction between epichlorohydrin and polybasic acid such as phthalic acid and dimer acid.

In the case of this exemplary embodiment, in order to improve the moisture-resistance reliability of encapsulation resin 62, it is preferable that ionic impurities such as Na ions and Cl ions in epoxy resin are extremely few.

In the case of this exemplary embodiment, it is preferable that epoxy resin is included in the range from 5 to 35 mass %, inclusive, with respect to the whole encapsulating resin composition. In this case, the fluidity of the encapsulating resin composition at the time of molding, and the physical property of encapsulation resin 62 are improved.

The curing agent to be included in the encapsulating resin composition of this exemplary embodiment is blended if necessary in consideration of the physical property of encapsulation resin 62, moldability of the resin composition, and the like. As the curing agent, a compound capable of reacting with the thermosetting resin to produce a cross-linking structure is used.

In a case where the thermosetting resin composition included in the encapsulating resin composition of this exemplary embodiment contains epoxy resin, the curing agent contains at least one component of a phenol compound, acid anhydride, and an imidazole compound. As mentioned above, it is preferable that benzoxazine resin functioning as both a thermosetting resin composition and a curing agent is contained. That is to say, when the thermosetting resin component contains epoxy resin, it preferably contains at least one component selected from the group consisting of a phenol compound, benzoxazine resin, acid anhydride, and an imidazole compound.

In the case where the thermosetting resin component contains an epoxy resin and a phenol compound, in a semiconductor device using the encapsulating resin composition, adhesion between a metal part including copper or silver and the encapsulation resin which is a cured product of the encapsulating resin composition is particularly improved. Furthermore, in the semiconductor device produced by using the encapsulating resin composition of this exemplary embodiment, adhesion between lead frame 53 provided with plated layer 54 and encapsulation resin 62 in FIG. 1 is particularly improved. In FIG. 1, encapsulation resin 62 formed from the encapsulating resin composition of this exemplary embodiment is excellent in both heat resistance and moisture resistance. When semiconductor device 1 is molded by using the encapsulating resin composition of this exemplary embodiment in FIG. 1, the encapsulating resin composition has excellent mold release property at the time of molding and excellent preservation stability (called "pot life").

It is preferable that the phenol compound included in the encapsulating resin composition of this exemplary embodiment contains at least one component selected from the group consisting of, for example, novolac-type resin such as phenol novolac resin, cresol novolac resin, and naphthol novolac resin; phenol aralkyl resin having a phenylene framework or a biphenylene framework; aralkyl-type resin such as naphthol aralkyl resin having a phenylene framework or a biphenylene framework; polyfunctional-type phenol resin such as triphenol methane-type resin; dicyclopentadiene-type phenol resin such as dicyclopentadiene-type phenol novolac resin, and dicyclopentadiene-type naphthol novolac resin; terpene-modified phenol resin; bisphenol-type resin such as bisphenol A and bisphenol F; and triazine-modified novolac resin. It is particularly preferable that the phenol compound contains at least one of phenol aralkyl-type phenol resin and biphenyl aralkyl-type phenol resin.

In the case of this exemplary embodiment, a stoichiometric equivalent ratio (curing agent/epoxy resin) of the curing agent with respect to epoxy resin is in a range from 0.5 to 1.5, inclusive. The equivalent ratio of 1.5 or less improves curability of the encapsulating resin composition as well as heat resistance and strength of encapsulation resin 62. The equivalent ratio of 0.5 or more particularly enhances adhesion between lead frame 53 provided with plated layer 54 and encapsulation resin 62, and, at the same time, makes the heat resistance and the moisture resistance of encapsulation resin 62 particularly excellent. It is more preferable that the equivalent ratio is in a range from 0.6 to 1.4, inclusive.

In particular, in a case where a thermosetting component contains epoxy resin and a phenol compound, it is preferable that an equivalent ratio of the epoxy group/the hydroxyl group in the thermosetting component is in a range from 0.9 to 1.5, inclusive. In this case, it is particularly preferable that the encapsulating resin composition contains an aromatic monocarboxylic acid having at least one electron-withdrawing functional group selected from a nitro group and a cyano group. It is further preferable that this equivalent ratio is in a range from 1.0 to 1.3, inclusive.

In the case of this exemplary embodiment, it is preferable that the thermosetting resin component does not have a nitro group. That is to say, thermosetting resin having no nitro group is useful. When the thermosetting resin component contains a curing agent, it is preferable that the curing agent does not have a nitro group. By suppressing the total amount of nitro groups included in the encapsulating resin composition, an effect of the nitro group on encapsulation resin 62 is suppressed. In particular, when the thermosetting resin component contains epoxy resin and a phenol compound as a curing agent, the nucleophilicity of the phenol compound is promoted by the nitro group, which may lengthen the gel time. When the thermosetting resin component and the phenol compound as the curing agent do not have a nitro group, the nucleophilicity of the phenol compound is not lowered. When a nitro group included in, for example, a thermosetting resin component, is reduced, or when material containing no nitro group is selected, the preferable reactivity of the phenol compound is maintained and an excellent effect of suppressing the lengthening of the gel time is obtained.

In the case of this exemplary embodiment, it is preferable that the curing accelerator contains at least one component selected from the group consisting of, for example, imidazoles such as 2-methyl imidazole, 2-ethyl imidazole, 2-phenyl imidazole, and 2-ethyl-4-methyl imidazole; cycloaminoclines such as 1,8-diazabicyclo[5.4.0]undecene-7, 1,5-diazabicyclo[4.3.0]nonene-5, and 5,6-dibutylamino-1,8-diazabicyclo[5.4.0]undecene-7; tertiary amines such as 2-(dimethylaminomethyl)phenol, triethylenediamine, benzyldimethylamine, triethanolamine, dimethylaminoethanol, and tris(dimethylamino methyl)phenol; organic phosphines such as tributyl phosphine, methyl diphenyl phosphine, triphenyl phosphine, tris(4-methyl phenyl)phosphine, diphenyl phosphine, addition reactant of triphenyl phosphine and p-benzoquinone, and phenyl phosphine; tetra-substituted phosphonium-tetra-substituted borate such as tetraphenyl-phosphonium-tetraphenyl borate, tetraphenylphosphonium-ethyl triphenyl borate, and tetrabutylphosphonium-tetrabutyl borate; quaternary phosphonium salt having a counter anion other than borate; and tetraphenyl boron salt such as 2-ethyl-4-methyl imidazole-tetraphenyl borate, and N-methylmorpholine-tetraphenyl borate. It is not preferable that the curing accelerator includes halogen and a sulfur element. When the curing accelerator contains imidazole, the imidazole also functions as a curing agent.

It is preferable that the curing accelerator is in a range from 0.001 to 0.5 mass %, inclusive, with respect to the whole epoxy encapsulating resin composition.

In the case of this exemplary embodiment, the inorganic filler preferably contains at least one component selected from the group consisting of, for example, fused silica such as spherical fused silica, crystalline silica, alumina, and silicon nitride. By allowing the encapsulating resin composition to contain the inorganic filler, the thermal expansion coefficient of encapsulation resin 62 is adjusted. In particular, it is preferable to select fused silica for the inorganic filler. The fused silica achieves high filling property of the inorganic filler in the encapsulating resin composition, and high fluidity at the time of molding of the encapsulating resin composition. It is preferable that the inorganic filler contains at least one component selected from the group consisting of alumina, crystalline silica, and silicon nitride. In this case, encapsulation resin 62 can have high thermal conductivity.

An average particle diameter of the inorganic filler is, for example, in a range from 0.2 to 70 μm. When the average particle diameter is in a range from 0.5 to 20 μm, particularly preferable fluidity is achieved at the time of molding of the encapsulating resin composition. The average particle diameter is a median diameter based on a volume calculated from the measurement value of particle size distribution by laser diffraction/scattering method, and measured by using a commercially available laser diffraction/scattering particle size distribution measurement device.

The inorganic filler may contain two or more components having different average particle diameters in order to adjust the viscosity of the encapsulating resin composition at the time of molding, the physical property of encapsulation resin 62, or the like.

The content of the inorganic filler is preferably in a range from 60 to 93 mass %, inclusive, with respect to the whole amount of the encapsulating resin composition. When the content of the inorganic filler material is less than 60 mass %, the linear expansion coefficient of encapsulation resin 62 may be increased. When the thermal expansion coefficient is increased, semiconductor device 1 is largely warped in a heating process such as solder reflow. When the content of the inorganic filler is more than 93 mass %, fluidity of the encapsulating resin composition is reduced, and thus problems such as wire sweep may occur at the time of molding.

The encapsulating resin composition may contain a coupling agent. The coupling agent improves the affinity between the inorganic filler and the thermosetting resin component. The containing of the coupling agent improves the adhesiveness of encapsulation resin 62 with respect to lead frame 53 in FIG. 1.

In this exemplary embodiment, it is preferable that the coupling agent contains at least one component selected from the group consisting of, for example, a silane coupling agent, a titanate coupling agent, an aluminum coupling agent, and an aluminum/zirconium coupling agent. The silane coupling agent preferably contains at least one component selected from the group consisting of, for example, glycidoxysilane such as γ-glycidoxypropyltrimethoxysilane, γ-glycidoxypropylmethykliethoxysilane, and β-(3,4-epoxy cyclohexyl)ethyltrimethoxysilane; amino silane such as N-β-(aminoethyl)-γ-aminopropyltrimethoxysilane, γ-aminopropyltriethoxysilane, and N-phenyl-γ-aminopropyltrimethoxysilane; alkyl silane; ureidosilane; and vinyl silane.

The coupling agent is preferably in a range from 0.1 to 2.0 mass %, inclusive, with respect to the total amount of inorganic filler and the coupling agent. The coupling agent contained in the encapsulating resin composition enhances adhesion between encapsulation resin 62 and lead frame 53 shown in FIG. 1.

The encapsulating resin composition may contain an additive agent other than the above-mentioned components in a range without impairing the effect of this exemplary embodiment. Examples of the additive agent include a mold release agent, flame retardant, coloring agent, a stress-lowering agent, and an ion trapping agent.

It is preferable that the mold release agent contains at least one component selected from the group consisting of, for example, carnauba wax, stearic acid, montanoic acid, a carboxyl group-containing polyolefin, ester wax, polyethylene oxide, and metallic soap.

It is preferable that the flame retardant contains at least one component selected from the group consisting of, for example, magnesium hydroxide, aluminum hydroxide, and red phosphorus.

The coloring agent is preferably at least one component selected from the group consisting of, for example, carbon black, red iron oxide, titanium oxide, phthalocyanine, and perylene black.

The stress-lowering agent is preferably at least one component selected from the group consisting of, for example, silicone elastomer, silicone resin, silicone oil, and butadiene-based rubber. The butadiene-based rubber contains, for example, at least one component of a methyl acrylate-butadiene-styrene copolymer and a methyl methacrylate-butadiene-styrene copolymer.

It is preferable that the encapsulating resin composition of this exemplary embodiment contains an ion trapping agent. The ion trapping agent has a function of trapping free chlorine ions in the encapsulating resin composition. In this exemplary embodiment, the ion trapping agent expresses excellent functions other than the function of trapping free chlorine ion when the ion trapping agent is used together with the substituted aromatic monocarboxylic acid. Since the encapsulating resin composition of this exemplary embodiment simultaneously contains the ion trapping agent and the substituted aromatic monocarboxylic acid, it expresses an excellent synergistic effect of enhancing adsorbing property of the substituted aromatic monocarboxylic acid to a metal surface. The reason why this excellent synergistic effect is obtained is because the ion trapping agent maintains pH of the encapsulating resin composition at the range of 5.0 to 7.5.

The encapsulating resin composition of this exemplary embodiment contains an ion trapping agent for maintaining pH at 5.0 to 7.5 in addition to aromatic carboxylic acid having at least one carboxyl group and an electron-withdrawing functional group, and being free from sulfur and halogen. Therefore, it is possible to obtain an excellent effect of largely improving the adhesion between the thermosetting resin included in the encapsulating resin composition and the metal part formed of copper or silver.

The ion trapping agent of this exemplary embodiment contains at least one of a hydrotalcite compound and a metal hydroxide, for example. The metal hydroxide contains at least one component selected from the group consisting of, for example, aluminum hydroxide, bismuth hydroxide, titanium hydroxide, and zirconium hydroxide.

Examples of the ion trapping agent include compounds of hydrotalcites, hydrous oxide of an element selected from aluminum, bismuth, titanium, and zirconium. These may be used singly, or two or more kinds may be used in combination.

The ion trapping agent to be used in this exemplary embodiment is described in detail. Among the ion trapping agents, hydrotalcites or aluminum-magnesium ion trapping agents are preferable, and Mg—Al—$CO_3$ hydrotalcites ion trapping agents are more preferable. Bi-based ion trapping agents are not preferable because they make pH of the encapsulating resin composition be acidic. Also, adsorption-type ion trapping agents have a problem that trapped anions are easily eliminated as compared with exchange-type ion trapping agents used in this exemplary embodiment.

The hydrotalcites used in this exemplary embodiment are described. Hydrotalcites whose weight-reduction value in thermal analysis from 25° C. to 800° C. is 10% or more and 70% or less are selected. Hydrotalcites having a weight-reduction value of 10% or more and 70% or less, and further preferably 50% or less in measurement from 25° C. to 800° C. at a temperature rising speed of 20° C./min by using a commercially available Thermogravimetry-Differential Thermal Analyzer (TG-DTA) are preferable. Hydrotalcites having a weight-reduction value of 70% or less include carbonate ions, crystalline water and the like at a high content and have an excellent effect of maintaining pH of the encapsulating resin composition at 5.0 to 7.5. When hydrotalcites are selected, weight reduction in a temperature range (for example, from 180° C. to 210° C. in which the weight reduction seems to occur because of dehydration of interlayer water) is excluded. Preferred are hydrotalcites whose weight-reduction value is 10% or more, further 15% or more, and 20% or more in a temperature range (for example, 220° C. to 600° C., or 220° C. to 800° C.) excluding a temperature range in which the weight reduction seems to occur because of dehydration of interlayer water.

For analysis of hydrotalcites in the encapsulating resin composition, ion chromatography is useful. When the content of hydrotalcites included in the encapsulating resin composition or in the thermosetting resin component therein is 200 ppm or more, it is possible to carry out an analysis by ion chromatography.

Containing of an ion trapping agent having ion exchange property achieves an excellent effect of maintaining pH of the encapsulating resin composition at 5.0 to 7.5. Maintaining of the pH of the encapsulating resin composition at a range from 5.0 to 7.5 achieves an effect of improving an adhesion between the metal surface such as copper or silver surface and a thermosetting resin component via the substituted aromatic monocarboxylic acid.

An example of a method for measuring pH of the encapsulating resin composition is described, but the method is not limited to the below-mentioned pH measurement method. An encapsulating resin composition as a subject to be measured is formed into a disk shape having a diameter of 60 mm and thickness of 2 mm at a mold temperature of 170° C., and heated and cured at 175° C. for 6 hours. This cured product is pulverized by a stamp mill, and pulverized products are allowed to pass through a 150 μm-mesh. The products which have passed the mesh are used as pH-measurement samples. The pH-measurement sample is weighed in an amount of 5 g, placed into a Teflon (trademark) container, and then wetted with 4 mL of methanol. To the sample, 46 mL of ion exchanged water is added and extracted at 120° C. for 24 hours to obtain a pH-measurement test liquid. The temperature of the pH-measurement test liquid is verified to be 25° C.±1° C. and then pH is measured by using a pH meter. When the pH is in a range from 5.0 to 7.5, adsorption efficiency of aromatic monocarboxylic acid (or substituted aromatic monocarboxylic acid) included in the encapsulating resin composition onto the metal surface is increased.

As the ion trapping agent, an ion trapping agent containing one or more of carbonate ion and a hydroxide ion (for example, hydrotalcite ion trapping agent or aluminum-magnesium ion trapping agent) is selected. The hydrotalcite ion trapping agent and aluminum-magnesium ion trapping agent preferably contains one or more of a carbonate ion and a hydroxide ion.

The pH of the encapsulating resin composition is described. When the pH of the pH-measurement test liquid obtained from a cured product of the encapsulating resin composition is less than 5.0, the adsorption efficiency of the aromatic monocarboxylic acid (or the substituted aromatic monocarboxylic acid) added to the encapsulating resin composition onto the metal surface is lowered, and adhesion strength of the aromatic monocarboxylic acid (or substituted aromatic monocarboxylic acid) onto the metal surface described in FIGS. 3 and 4 is lowered. The reason why the adhesion strength is lowered when pH is less than 5.0 is because $H^+$ (protons) included in encapsulation resin 62 become excessive and the reaction between encapsulation resin 62 and lead frame 53 (or metal part M) in FIGS. 3 and 4 does not easily proceed. When $H^+$ (protons) included in encapsulation resin 62 are excessive, an effect of addition of the aromatic monocarboxylic acid is reduced and moisture-resistance reliability in semiconductor device 1 shown in FIG. 1 is reduced.

When the pH of the pH-measurement test liquid obtained from a cured product of an encapsulating resin composition is more than 7.5, cation components (for example, $Mg^{2+}$, $Ca^{2+}$, $Na^+$, and the like) included in encapsulation resin 62 are increased. The cation components such as $Mg^{2+}$ included in encapsulation resin 62 inhibit the reaction between the aromatic monocarboxylic acid (or the substituted aromatic monocarboxylic acid) and the metal surface shown in FIGS. 3 and 4. When the cation components included in encapsulation resin 62 inhibit the reaction between the aromatic monocarboxylic acid and the metal surface, the adhesion strength between encapsulation resin 62 and the metal surface is lowered.

When the pH of the encapsulating resin composition is in a range from 5.0 to 7.5, inclusive, the reactivity between the aromatic monocarboxylic acid (or the substituted aromatic monocarboxylic acid) and the metal surface shown in FIG. 3 or 4 is increased. The pH in a range from 6.0 to 6.5, inclusive, is further useful. When the pH-measurement test liquid has pH in a range from 6.0 to 6.5, inclusive, the reactivity between the aromatic monocarboxylic acid (or the substituted aromatic monocarboxylic acid) and the metal surface shown in FIG. 3 or 4 is further enhanced.

Ion exchange mechanism for making pH of the encapsulation resin in a range from 5.0 to 7.5, inclusive, by using an ion trapping agent in this exemplary embodiment is described with reference to FIG. 8. It is desirable that the content of the ion trapping agent with respect to the whole encapsulating resin composition be in a range from 0.05 mass % to 0.6 mass %, inclusive. When the content of the ion trapping agent is less than 0.05 mass %, a pH adjustment function by the ion trapping agent is reduced. Even if the content of the ion trapping agent is higher than 0.6 mass %, the addition effect of the ion trapping agent is not obtained.

Figure 8:
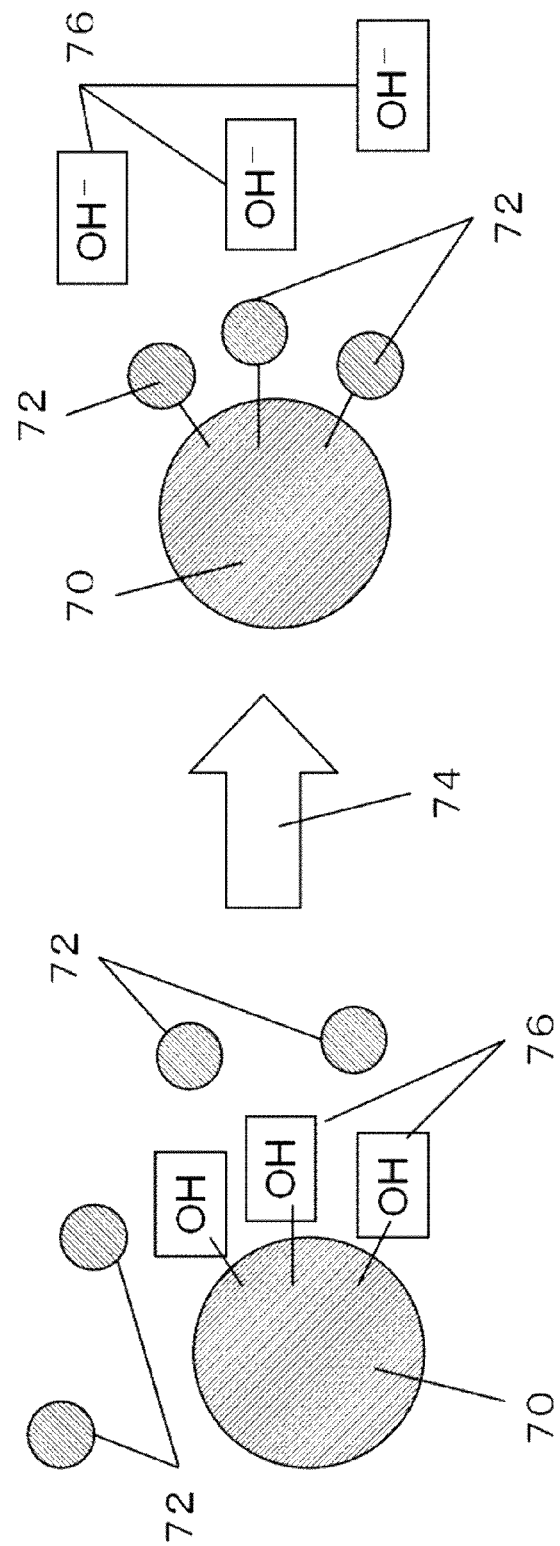
FIG. 8 is a schematic sectional view showing an ion exchange mechanism of an ion trapping agent.

FIG. 8 is a schematic view showing a state in which an ion trapping agent adsorbs anions 72 such as CY (chlorine) so as to adjust pH to 5.5 or more. Arrow 74 of FIG. 8 shows a state in which ion trapping agent 70 adsorbs anions 72. A view in the left side to arrow 74 of FIG. 8 is a schematic view for illustrating ion trapping agent 70 before adsorbing anions. The left view of FIG. 8 shows that ion trapping agent 70 adsorbs OH groups 76 on the surface of ion trapping agent 70. In the left view of FIG. 8, anions 72 such as chlorine ions ($Cl^-$) are present around ion trapping agent 70. A view in the right side to arrow 74 of FIG. 8 shows ion trapping agent 70 in a state in which ion trapping agent 70 has adsorbed anions 72.

An ion exchange reaction for making pH of encapsulation resin 62 to a range from 5.0 to 7.5, inclusive, by using an ion trapping agent is described with reference to chemical formulae (2) and (3).

Chemical formula (2) represents an anion exchange reaction. This anion exchange reaction easily proceeds at the acid side, and pH of encapsulation resin 62 is increased to 5.0 or more, 6.0 or more and 6.5 or more, by the reaction of the chemical formula (2). In chemical formula (2), R represents an ion trapping agent, and M represents a monovalent cation or a divalent cation.

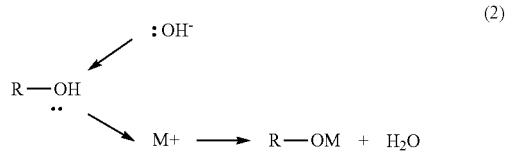

Chemical formula (3) represents a cation exchange reaction. The cation exchange reaction proceeds at a basic side. The pH of encapsulation resin 62 is reduced to 7.5 or less, further 7.0 or less, and 6.5 or less by a reaction shown by chemical formula (3). In chemical formula (3), R represents an ion trapping agent, and A represents a monovalent anion such as halogen.

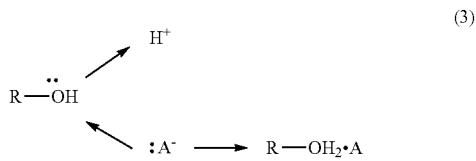

It is not preferable that a compound including a sulfur (S) atom is not blended and used in the encapsulating resin composition of this exemplary embodiment. Sulfur (5) may be included just as inevitable impurity. The sulfur content of the encapsulating resin composition, by X-ray fluorescence analysis, is preferably 0.05 mass % or less in terms of $SO_3$.

The sulfur content of the encapsulating resin composition, measured by X-ray fluorescence analysis, is 0.1 mass % or less, more preferably 0.05 mass % or less, and particularly preferably 0.025 mass % in terms of $SO_3$. In this exemplary embodiment, it is preferable that the encapsulating resin composition does not contain a sulfur compound.

Constituting components of an encapsulating resin composition are mixed with each other to obtain the encapsulating resin composition shown in this exemplary embodiment. Specifically, constituting components including, for example, a thermosetting component, a curing accelerator, an inorganic filler, and substituted aromatic monocarboxylic acid are mixed with each other by a mixer, a blender, or the like, until a sufficiently uniform mixture is obtained. Subsequently, the mixture is melted and mixed in a state in which it is heated by using a kneading machine such as a heat roll and a kneader, and finally the mixture is cooled to room temperature. The obtained mixture is pulverized by a well-known method. Thus, powdery encapsulating resin composition is produced. The encapsulating resin composition may be any shapes other than a powdery shape, and may be, for example, a tablet shape. The dimension or mass of the encapsulating resin composition in a tablet shape is designed by molding conditions.

It is preferable that the encapsulating resin composition of this exemplary embodiment is a solid at 25° C. Specifically, it is preferable that the encapsulating resin composition is a solid whose elastic modulus is 0.3 MPa or more at 25° C. The encapsulating resin composition, which is a solid whose elastic modulus at 25° C. is 0.3 MPa or more, is molded by pressure-molding processes such as an injection molding process, a transfer molding process, and a compression molding process described with reference to FIGS. 6A, 6B, 7A, 7B, and the like, to obtain encapsulation resin 62. It is particularly preferable that the encapsulating resin composition is solid in any temperature in the range from 15 to 25° C., solid in any temperature in the range from 5 to 35° C., and further has an elastic modulus of 0.5 MPa or more in the temperature ranges.

In order to allow the encapsulating resin composition to be solid at 25° C., it is preferable that the thermosetting resin component is solid at 25° C., and has the elastic modulus of 0.3 MPa or more. The thermosetting resin component may include a liquid component as long as a solid component in the thermosetting resin component absorbs the liquid component, so that the thermosetting resin component as a whole is a solid and further has an elastic modulus of 0.3 MPa or more.

When the encapsulating resin composition has an elastic modulus at 25° C. of 0.3 of MPa or more, it can be easily molded by pressure-molding processes such as an injection molding process, a transfer molding process, and a compression molding process. The elastic modulus is preferably in a range from 0.3 MPa to 350,000 MPa, inclusive. The elastic modulus of the encapsulating resin composition is controlled by appropriately setting composition of the encapsulating resin composition in the range described in this exemplary embodiment. When the elastic modulus of the encapsulating resin composition is 0.3 MPa or more, pulverization efficiency of the encapsulating resin composition by a pulverizer is high. However, when the elastic modulus is less than 0.3 MPa, the pulverization efficiency is lowered because the encapsulating resin composition is attached to the inside of a pulverizer.

A spiral flow length of the encapsulating resin composition at 120° C. is preferably 1 cm or more. When the spiral flow length is 1 cm or more, the fluidity of the encapsulating resin composition at the time of molding is excellent. It is preferable that the spiral flow length is in the range from 1 to 200 cm, inclusive. It is also preferable that the spiral flow length of the encapsulating resin composition at 160° C. is in a range from 20 to 250 cm, inclusive. The spiral flow length of 1 cm or more suppresses the occurrence of non-filling of encapsulation resin 62, a so-called weld void, due to deterioration of fluidity at the time of molding of the encapsulating resin composition. Furthermore, the spiral flow length of 1 cm or more suppresses deformation of wire 56 for connecting semiconductor element 50 to lead frame 53. Composition of the encapsulating resin composition is appropriately set in a range described in this exemplary embodiment as long as the spiral flow length is 1 cm or more.

Gel time of the encapsulating resin composition is preferably in a range from 10 to 100 seconds, inclusive. When the gel time is 100 seconds or less, a molding cycle of encapsulation resin 62 is shortened and an effect of increasing the productivity of semiconductor device 1 is achieved. The gel time is defined as time required until a measurement value of a torque reaches 0.05 (N/m) from start of heating. The torque is measured by using CURELASTOMETER type VPS manufactured by JSR Trading Co., Ltd. while the encapsulating resin composition is heated at 175° C.

Examples of semiconductor device 1 having encapsulation resin 62 produced from the encapsulating resin composition and a method for manufacturing semiconductor device 1 are described with reference to FIG. 1.

In FIG. 1, examples of a package form of semiconductor device 1 include insertion-type packages such as Mini, D pack, D2 pack, To220, To3P, and Dual Inline Package (DIP), or surface mounting-type packages such as Quad Flat Package (QFP), Small Outline Package (SOP), and Small Outline J lead Package (SOJ).

FIG. 1 is a sectional view of semiconductor device 1 in accordance with this exemplary embodiment. Semiconductor device 1 includes lead frame 53 made of metal, semiconductor element 50 mounted on lead frame 53, wires 56 electrically connecting semiconductor element 50 to lead frame 53, and encapsulation resin 62 encapsulating semiconductor element 50.

As shown in FIG. 1, lead frame 53 includes die pad 58, inner lead 521, and outer lead 522. Lead frame 53 is made of, for example, copper or iron alloy such as 42 alloy. Lead frame 53 includes plated layer 54. Plated layer 54 suppresses corrosion of lead frame 53. Plated layer 54 includes at least one component selected from silver, nickel and palladium. Plated layer 54 may include only one metal selected from silver, nickel, and palladium, and may include an alloy including at least one metal of silver, nickel, and palladium. Plated layer 54 may have a laminated structure, and specifically include a plurality of laminated structures including, for example, a palladium layer, a nickel layer, and metal. A thickness of plated layer 54 is, but not limited to, for example, in a range from 1 to 20 µm.

An example of a method for manufacturing semiconductor device 1 shown in FIG. 1 is described with reference to FIG. 1. As shown in FIG. 1, semiconductor element 50 is fixed to die pad 58 of lead frame 53 with appropriate die-bonding material 60. Thus, semiconductor element 50 is mounted on lead frame 53. Examples of semiconductor element 50 include an integrated circuit, a large-scale integrated circuit, a transistor, a thyristor, a diode, or a solid-state image sensing element. Semiconductor element 50 may be a new power device of, for example, SiC, GaN, and the like.

Subsequently, as shown in FIG. 1, semiconductor element 50 and inner leads 521 of lead frame 53 are coupled to each other with wires 56. Wire 56 may be made of gold, but it may include at least one of silver or copper. For example, wire 56 may be made of silver or copper. In a case where wire 56 includes at least one of silver and copper, wire 56 may be surface-treated with a thin film of metal such as palladium.

Subsequently, as shown in FIG. 1, an encapsulating resin composition is molded so as to form encapsulation resin 62 for encapsulating semiconductor element 50. Encapsulation resin 62 encapsulates also wires 56. Encapsulation resin 62 encapsulates also the pad 58 and inner leads 531. Therefore, encapsulation resin 62 is brought into contact with lead frame 53, and is brought into contact with plated layer 54 when lead frame 53 includes plated layer 54.

The encapsulating resin composition is molded by a pressure-molding process so as to produce encapsulation resin 62. Examples of the pressure-molding process include an injection molding process, a transfer molding process, or a compression molding process. These molding processes are described with reference to FIGS. 6A, 6B, 7A, and 7B.

Figure 6A:
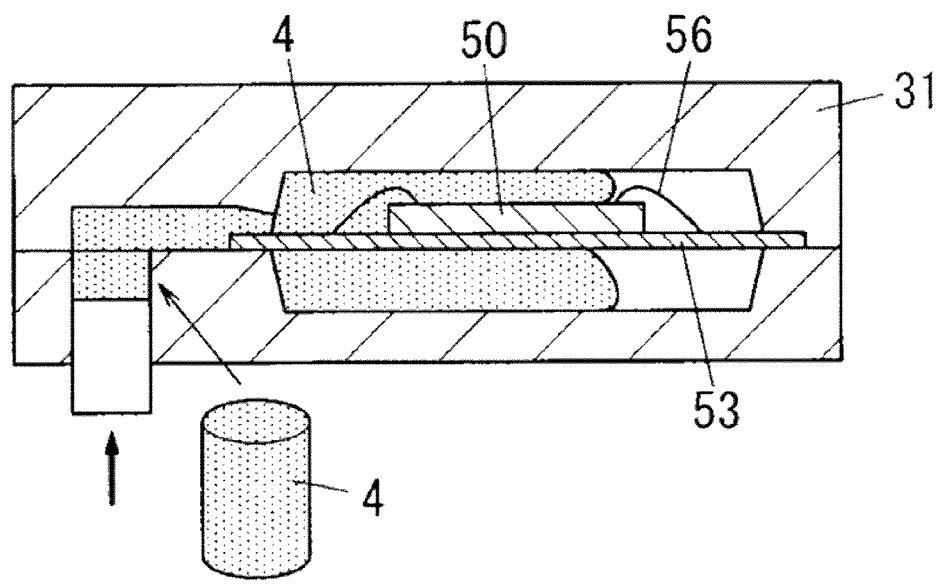
FIG. 6A and FIG. 6B are schematic sectional views each showing a process for producing an encapsulation resin by a transfer molding process so as to obtain a semiconductor device.
Figure 6B:
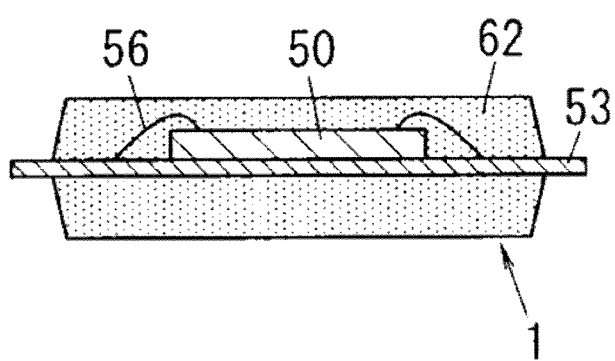

An example of a method for producing encapsulation resin 62 by a transfer molding process is shown in FIGS. 6A and 6B. As shown in FIG. 6A, lead frame 53 on which semiconductor element 50 is mounted is disposed in mold 31 for transfer molding. In this state, encapsulating resin composition 4 is heated and melted, and then injected into mold 31. Encapsulating resin composition 4 is further heated and cured inside mold 31. Thus, encapsulation resin 62 is produced, and semiconductor device 1 including lead frame 53, semiconductor element 50, wires 56, and encapsulation resin 62 is obtained. Subsequently, mold 31 is opened, and as shown in FIG. 6B, and semiconductor device 1 is taken out from mold 31.

Figure 7A:
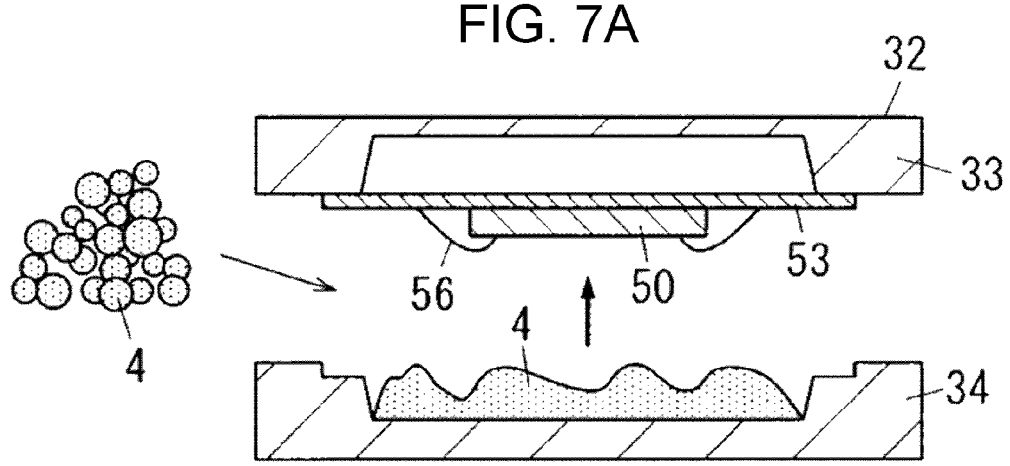
FIG. 7A and FIG. 7B are schematic sectional views each showing a process for producing encapsulation resin by a compression molding process so as to obtain a semiconductor device.
Figure 7B:
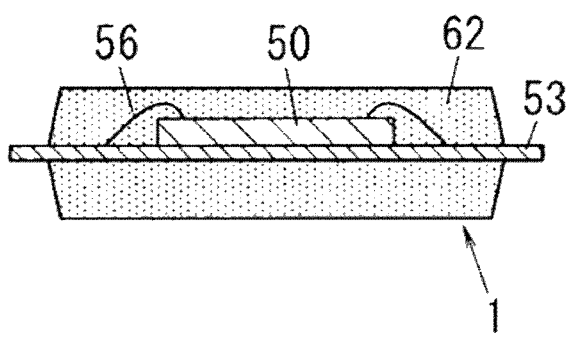

An example of a method for manufacturing encapsulation resin 62 by a compression molding process is shown in FIGS. 7A and 7B. As shown in FIG. 7A, lead frame 53 on which semiconductor element 50 is mounted and encapsulating resin composition 4 are disposed between upper mold 33 and lower mold 34 constituting mold 32 for compression molding. Then, upper mold 33 and lower mold 34 are brought near to each other while upper mold 33 and lower mold 34 are heated. Next, encapsulating resin composition 4 is heated and cured while they are pressurized inside mold 32. Encapsulation resin 62 is produced by heating and curing, and semiconductor device 1 including lead frame 53, semiconductor element 50, wires 56, and encapsulation resin 62 is obtained. Then, mold 32 is opened and semiconductor device 1 is taken out from mold 32 as shown in FIG. 7B.

It is preferable that a molding pressure at which the encapsulating resin composition is molded by a pressure-molding process is 3.0 MPa or more and a molding temperature is 120° C. or more. When the conditions of 3.0 MPa or more and 120° C. or more are employed, a problem of non-filling, so-called weld void or inside void does not occur. As a result, semiconductor device 1 in which semiconductor element 50 is encapsulated with uniform encapsulation resin 62 is obtained.

In particular, in a case of the transfer molding process, an injection pressure of the encapsulating resin composition to the mold is preferably 3 MPa or more, and more preferably in the range from 4 to 710 MPa. The heating temperature (mold temperature) is preferably 120° C. or more and more preferably in the range from 160 to 190° C. The heating time is preferably in the range from 30 to 300 seconds, and more preferably in the range from 60 to 180 seconds.

In the transfer molding process, encapsulation resin 62 is produced in the mold, encapsulation resin 62 is heated and post-cured ("post-cure") while the mold is closed, and then the mold is opened and semiconductor device 1 is taken out. Heating conditions for the post-cure include, for example, heating time in a range from 160 to 190° C., and heating time in a range from 2 to 8 hours.

In the case of the compression molding, a compression pressure is preferably 3 MPa or more and more preferably in the range from 5.0 to 10 MPa. The heating temperature (mold temperature) is preferably 120° C. or greater and more preferably in a range from 150 to 185° C. The heating time is preferably in a range from 60 to 300 seconds.

Semiconductor device 1 obtained in this exemplary embodiment has an excellent effect that an encapsulating resin composition includes no or a low content of a sulfur compound, but even when lead frame 53 includes plated layer 54, high adhesion strength between encapsulation resin 62 and lead frame 53 is obtained. Semiconductor device 1 obtained in this exemplary embodiment has an excellent effect that encapsulation resin 62 is not peeled off from lead frame 53 even when semiconductor device 1 undergoes heating or vibration.

This exemplary embodiment has an effect that the encapsulating resin composition includes no or a low content of sulfur compound, so that wire 56 that is brought into contact with encapsulation resin 62 is not easily corroded even at high temperature and/or high humidity. Therefore, at high temperature and/or high humidity, conduction failure or disconnection does not easily occur in semiconductor device 1. As mentioned above, semiconductor device 1 has high reliability.

According to the encapsulating resin composition of this exemplary embodiment, since lengthening of gel time does not occur associated with the improvement of adhesion strength, a molding cycle in production of encapsulation resin 62 is further shortened, thus enhancing the production efficiency of semiconductor device 1.

EXAMPLES

Hereinafter, the effects of this exemplary embodiment are described in more detail by way of Examples. Note here that the present disclosure is not limited to these Examples.
Preparation of Composition In Examples and Comparative Examples, components shown in the below-mentioned Tables are blended, mixed and dispersed uniformly by using a mixer, followed by heating and kneading at 100° C. by using a kneader to obtain a mixture. The obtained mixture is cooled and then pulverized into powder. The powder is made into a tablet to obtain a tablet-shaped encapsulating resin composition.

Encapsulating resin compositions obtained in Examples and Comparative Examples are analyzed by diffuse reflectance infrared Fourier transform spectrometry. In each Example, a peak derived from a nitro group is observed, while in each Comparative Example, a peak derived from a nitro group is not observed.

Note here that details of the components shown in Tables are as follows.

Filler: spherical fused silica, manufactured by Denka Company Limited, product number: FB940

Silane coupling agent A: 3-mercaptopropyltrimethoxysilane, manufactured by Shin-Etsu Chemical Co., Ltd., product number: KBM803

Silane coupling agent B: N-phenyl-3-aminopropyltrimethoxysilane, manufactured by Shin-Etsu Chemical Co., Ltd., product number: KBM573

Epoxy resin A: biphenyl-aralkyl-type epoxy resin, manufactured by Nippon Kayaku Co., Ltd, product number: NC3000, epoxy equivalent: 275

Epoxy resin B: biphenyl-type epoxy resin, manufactured by Mitsubishi Chemical Corp., product number: YX4000, epoxy equivalent: 186

Epoxy resin C: cresol novolac-type epoxy resin, manufactured by DIC, product number: N-660, epoxy equivalent: 207

Phenol novolac resin: manufactured by Meiwa Plastic Industries, Ltd, product number: HF-1M Phenol aralkyl resin: manufactured by Meiwa Plastic Industries, Ltd, product number: MEH-7800.

Biphenyl aralkyl resin: manufactured by Meiwa Plastic Industries, Ltd, product number: MEH-7851SS.

Cyanate ester resin: manufactured by Lonza Japan Ltd., product number: BADCY.

Imidazole: manufactured by Shikoku Chemicals Corporation, product number: 2PZ-PW.

Mold release agent: carnauba wax.

Ion trapping agent A: manufactured by Toagosei Co., Ltd., product number: IXE770D.

Ion trapping agent B: manufactured by Toagosei Co., Ltd., product number: IXE500.

Ion trapping agent C: manufactured by Toagosei Co., Ltd., product number: IXE300.

Curing accelerator (TPP): triphenyl phosphine, Hokko Chemical Industry Co., Ltd.

Curing accelerator (DBU): 1,8-diazabicyclo[5.4.0]undecene-7.

Pigment: manufactured by Mitsubishi Chemical Corp., product number: MA600.

3-nitrobenzoic acid: manufactured by Tokyo Chemical Industry Co., Ltd., melting point: 141 to 144° C.

nitrobenzene: manufactured by Tokyo Chemical Industry Co., Ltd., melting point: 6° C.

benzoic acid: manufactured by Tokyo Chemical Industry Co., Ltd., melting point: 123 to 126° C.

2-methyl-3-nitrobenzoic acid: manufactured by Tokyo Chemical Industry Co., Ltd., melting point: 183 to 186° C.

3-cyanobenzoic acid: manufactured by Tokyo Chemical Industry Co., Ltd., melting point: 218.0 to 222.0° C.

3-nitroisophthalic acid: manufactured by Tokyo Chemical Industry Co., Ltd., melting point: 261° C.

4-nitroisophthalic acid: manufactured by Spring Pharma Tech Co. Ltd, melting point: 258° C.

5-nitroisophthalic acid: manufactured by Tokyo Chemical Industry Co., Ltd., melting point: 261° C.

nitroterephthalic acid: manufactured by Tokyo Chemical Industry Co., Ltd., melting point: 271° C.

4,4'-dithiomorpholine: manufactured by Tokyo Chemical Industry Co., Ltd., melting point: 125° C.

Evaluation Tests

Encapsulating resin compositions obtained in Examples and Comparative Examples are subjected to the following evaluation tests. The results of the evaluation tests are shown in the below-mentioned tables.

(1) Evaluation of amount of sulfur in terms of $SO_3$

Each of the encapsulating resin compositions is subjected to X-ray fluorescence analysis. Based on the result, a sulfur content of each of the encapsulating resin compositions is calculated as an amount in terms of $SO_3$.

(2) Evaluation of Gel Time

Each of the encapsulating resin compositions is measured for torque while it is heated at 175° C. by using CURELASTOMETER type VPS manufactured by JSR Trading Co., Ltd. Time required until a measurement value of the torque reaches 0.05 (N/m) from the start time of heating is measured, and the resulting time is referred to as the gel time.

(3) Evaluation of Curability

Each of the encapsulating resin compositions is measured for torque while it is heated at 175° C. by using CURELASTOMETER type VPS manufactured by JSR Trading Co., Ltd. A measurement value of the torque at the time when 100 seconds have passed from the start time of heating is an index of curability.

(4) Pulverizability

Pulverizability is evaluated as "Good" in a case where the resin can be formed into powdery shape by using a commercially available cutter mill and allowing the resin to pass through 5 mm-diameter mesh screen, and evaluated as "Poor" in a case where the resin adheres or is attached to the screen mesh, causing clogging, or where the resin is softened and cannot be pulverized.

(5) Evaluation of Shore D Hardness

Each of the encapsulating resin compositions is molded by a transfer molding process under the conditions of an injection pressure of 9.8 MPa, a molding temperature of 175° C., and molding time of 100 seconds so as to produce a disk sample having a thickness of 3 mm. Shore D hardness of this sample is measured by using a hardness tester.

The Shore D hardness of less than 80 makes it difficult to take out a molded product from the mold, that is, to easily cause mold release failure.

(6) Evaluation of Adhesion

Each of the encapsulating resin composition is molded by a transfer molding process on a silver plate by using a mold under the conditions of a mold temperature of 175° C., an injection pressure of 7.0 MPa, and a curing time of 120 seconds so as to produce a cured product. Adhesion strength between the cured product and the plate is measured by using a Bond Tester manufactured by Dage. In a case where the lead frame has a plated layer including silver, in order to prevent exfoliation of the encapsulation resin from the lead frame at the time of reflow of a semiconductor device, the adhesion strength is preferably 25 MPa or more.

The same evaluation tests are carried out also in the case where each of a palladium plate and a nickel plate is used.

(7) Evaluation of Reflow Resistance

On a lead frame made of copper and partially including a silver-plated layer, a semiconductor element is mounted. On the lead frame, each of the encapsulating resin compositions is molded by a transfer molding process using a multitransfer press (manufactured by APIC YAMADA CORPORATION) under the conditions of a mold temperature of 175° C., an injection pressure of 7.0 Mpa, and a curing time of 120 seconds so as to produce an encapsulation resin. Subsequently, the encapsulation resin is heated at 175° C. for 6 hours as post-cure. Thus, a rectangular LQFP (Low Profile Quad Flat Package) having a dimension of 28 mm×28 mm is obtained as a semiconductor device. This semiconductor device is left in an atmosphere at 60° C. and 60% RH, which has been controlled by a thermo-hygrostat, for 120 hours. This process is carried out as moisture absorption treatment. Subsequently, the semiconductor device is subjected to reflow processing under the conditions of a peak temperature of 265° C. by using a far-infrared radiation-type reflow furnace. Subsequently, presence of exfoliation between the encapsulation resin and the lead frame in the semiconductor device is checked by using an ultrasonic exploration device. A case where exfoliation is not observed is evaluated as "Good," and where exfoliation is observed is evaluated as "Poor."

(8) Evaluation of Reliability A

A semiconductor element is mounted on a lead frame made of a copper alloy (manufactured by Kobe Steel, Ltd., product name: KFC-H) and partially including a silver-plated layer. The lead frame and the semiconductor element are coupled to each other by copper wires. Then, each of the encapsulating resin compositions is molded by a transfer molding process under the conditions of a mold temperature of 175° C., an injection pressure of 7.0 MPa, and curing time of 120 seconds so as to produce an encapsulation resin. Thus, as the semiconductor device, DIP 16 pin is produced. While this semiconductor device is disposed in a dryer and kept at 250° C. for 1000 hours, electrical resistance between terminals of the semiconductor device is measured. Time required until a measurement value of electrical resistance reaches 1.5 times as large as the initial value is measured. A case where the electrical resistance value does not reach 1.5 times as large as the initial value even after 1000 hours have passed is evaluated as "Good." In measurement of electrical resistance between the semiconductor devices while the temperature is kept at 250° C. for 1000 hours, a case where the electrical resistance value reaches 1.5 times as large as the initial value before 1000 hours have passed is evaluated as "NG." At this time, instead of describing "NG," the period of time which has passed until the electrical resistance reaches 1.5 times as large as the initial value is described in the tables.

(9) Evaluation of Reliability B

A semiconductor element is mounted on a lead frame made of a copper alloy (manufactured by Kobe Steel, Ltd., product name: KFC-H) and partially including an Ag-plated layer. The lead frame and the semiconductor element are coupled to each other by copper wire. Then, an encapsulating resin composition is molded by a transfer molding process under the conditions of a mold temperature of 175° C., an injection pressure of 7.0 MPa, and curing time of 120 seconds so as to produce encapsulation resin. Thus, as the semiconductor device, DIP 16 pin is produced. While this semiconductor device is subjected to unbiased highly accelerated stress testing (UHAST) under the conditions of 130° C. and 85% RH for 1000 hours, electrical resistance between terminals of the semiconductor device is measured, and time required until a measurement value of electrical resistance reaches 1.5 times as large as the initial value is measured. A case where the electrical resistance value does not reach 1.5 times as large as the initial value even after 1000 hours have passed is evaluated as "Good." A case where the electrical resistance value reaches 1.5 times as large as the initial value before 1000 hours have passed is evaluated as "NG." At this time, instead of describing "NG," the period of time which has passed until the electrical resistance reaches 1.5 times as large as the initial value is described in the tables. For example, in Comparative Example 1 shown in Table 2, the electrical resistance value becomes 1.5 times as large as the initial value when the semiconductor device is subjected to the UHAST for 336 hours.

Hereinafter, with reference to Tables 1 to 3, an example of the results of the experiments carried out by the present inventors is described. Table 1 shows Examples 1 to 12, and Table 2 shows Comparative Examples 1 to 17. Table 3 shows Examples 1 to 5, and Comparative Examples 18 to 20. Examples 1 to 5 in Table 3 and Examples 1 to 5 in Table 1 are the same except for the description of pH in the former.

TABLE 1

| | | Examples | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| Composition (part by mass) | Filler | 874 | 874 | 874 | 874 | 874 | 874 | 874 | 847 | 874 | 874 | 874 | 874 |
| | Silane coupling agent A | — | — | — | — | — | — | — | — | — | — | — | — |
| | Silane coupling agent B | 5 | 5 | 5 | 5 | 5 | 5 | 5 | 5 | 5 | 5 | 5 | 5 |
| | Epoxy resin A | 64 | 64 | 63 | 61 | 60 | — | 106 | 69 | 30 | 64 | 64 | 63 |
| | Epoxy resin B | — | — | — | — | — | — | — | — | 30 | — | — | — |
| | Epoxy resin C | — | — | — | — | — | 89 | — | — | — | — | — | — |
| | Epoxy resin D (HP4032D) | — | — | — | — | — | — | — | — | — | — | — | — |
| | Phenol novolac resin | — | — | — | — | — | 48 | — | — | — | — | — | — |
| | Phenol aralkyl resin | 21 | 21 | 21 | 21 | 20 | — | — | — | 20 | 21 | 21 | 21 |
| | Biphenyl aralkyl resin | 26 | 26 | 26 | 26 | 25 | — | — | — | 30 | 26 | 26 | 26 |
| | Cyanate ester resin | — | — | — | — | — | — | — | 68 | — | — | — | — |
| | Acrylic acid ester | — | — | — | — | — | — | — | — | — | — | — | — |
| | Imidazole | — | — | — | — | — | — | 5 | — | — | — | — | — |
| | Mold release agent | 4 | 4 | 4 | 4 | 4 | 4 | 4 | 4 | 4 | 4 | 4 | 4 |
| | Ion trapping agent A | 3 | 3 | 3 | 3 | 3 | 3 | 3 | 3 | 3 | 3 | 3 | 3 |
| | Ion trapping agent B | — | — | — | — | — | — | — | — | — | — | — | — |
| | Ion trapping agent C | — | — | — | — | — | — | — | — | — | — | — | — |
| | Curing accelerator (TPP) | 1 | 1 | 1 | 1 | 1 | 1 | — | 1 | 1 | 1 | 1 | — |
| | Curing accelerator (DBU) | — | — | — | — | — | — | — | — | — | — | — | 1 |
| | Pigment | 2 | 2 | 2 | 2 | 2 | 2 | 2 | 2 | 2 | 2 | 2 | 2 |
| | 3-nitrobenzoic acid | 0.1 | 0.01 | 1 | 3 | 6 | 1 | 1 | 1 | 1 | — | — | 1 |
| | Nitrobenzene | — | — | — | — | — | — | — | — | — | — | — | — |
| | Benzoic acid | — | — | — | — | — | — | — | — | — | — | — | — |
| | 2-methyl-3-nitrobenzoic acid | — | — | — | — | — | — | — | — | — | 0.1 | — | — |
| | 3-cyanobenzoic acid | — | — | — | — | — | — | — | — | — | — | 0.1 | — |
| | 3-nitroisophthalic acid | — | — | — | — | — | — | — | — | — | — | — | — |
| | 4-nitroisophthalic acid | — | — | — | — | — | — | — | — | — | — | — | — |
| | 5-nitroisophthalic acid | — | — | — | — | — | — | — | — | — | — | — | — |
| | Nitroterephthalic acid | — | — | — | — | — | — | — | — | — | — | — | — |
| | Salicylic acid | — | — | — | — | — | — | — | — | — | — | — | — |
| | 4,4'-dithiomorpholine | — | — | — | — | — | — | — | — | — | — | — | — |
| | Total | 1000.1 | 1000.01 | 1000 | 1000 | 1000 | 1027 | 1000 | 1000 | 1000 | 1000 | 1000 | 1000 |
| Evaluation | Sulfur content in terms of SO3 (mass %) | 0.02 | 0.02 | 0.02 | 0.02 | 0.02 | 0.02 | 0.02 | 0.02 | 0.02 | 0.02 | 0.02 | 0.02 |
| | Gel time (sec) | 30 | 30 | 32 | 33 | 45 | 28 | 45 | 28 | 40 | 30 | 30 | 30 |
| | Curability (N/m) | 0.88 | 0.89 | 0.85 | 0.86 | 0.53 | 2.3 | 3.5 | 4.2 | 0.82 | 0.86 | 0.88 | 0.86 |

TABLE 1-continued

|  | Examples | | | | | | | | | | | |
| --- | --- | --- | --- | --- | --- | --- | --- | --- | --- | --- | --- | --- |
|  | 1 | 2 | 3 | 4 | 5 | 6 | 7 | 8 | 9 | 10 | 11 | 12 |
| Pulverizability | Good | Good | Good | Good | Good | Good | Good | Good | Good | Good | Good | Good |
| Shore D hardness | 80 | 81 | 80 | 80 | 76 | 83 | 82 | 84 | 79 | 80 | 81 | 80 |
| Ag-adhesion (MPa) | 32 | 27 | 33 | 34 | 34 | 24 | 32 | 20 | 30 | 32 | 33 | 31 |
| Pd-adhesion (MPa) | 22 | 20 | 22 | 23 | 23 | 17 | 22 | 15 | 20 | 21 | 22 | 21 |
| Ni-adhesion (MPa) | 18 | 16 | 18 | 19 | 20 | 13 | 17 | 12 | 16 | 18 | 19 | 18 |
| Reflow resistance | Good | Good | Good | Good | Good | Good | Good | Good | Good | Good | Good | Good |
| Reliability evaluation A (hour) | Good | Good | Good | Good | Good | Good | Good | Good | Good | Good | Good | Good |
| Reliability evaluation B (hour) | Good | Good | Good | Good | Good | Good | Good | Good | Good | Good | Good | Good |

In Table 1, relations are evaluated between a blending amount of 3-nitrobenzoic acid and adhesion property, reflow resistance, and reliability, or the like. The blending amounts of 3-nitrobenzoic acid with respect to the total amount (where the whole amount of the encapsulating resin composition is 1000 parts by mass) in Examples 1, 2, 3, 4, and 5 are 0.1, 0.01, 1, 3, and 6 (parts by mass), respectively. Table 1 also shows evaluation of gel time and the like of the encapsulating resin composition. The gel time is measured as time for a torque value to reach 0.5 N/m from starting of measurement at a set temperature of 175° C. by using CURELASTOMETER type VPS manufactured by JSR Trading Co., Ltd.

As is apparent from Examples 1 and 3 to 5 in Table 1, when the blending amount of 3-nitrobenzoic acid is in the range from 0.01 mass % to 0.6 mass % (mass % where the whole amount of the encapsulating resin composition is 100), silver adhesion strength shows sufficiently high values from 32 MPa to 34 MPa, and the reflow resistance and the reliability are both excellent ("Good"). However, as compared with Example 4 in which the blending amounts of 3-nitrobenzoic acid is 0.3 mass %, in Example 5 in which the blending amounts is 0.6 mass %, the silver adhesion strength is the same level but the gel time is longer. Thus, even when the blending amount of 3-nitrobenzoic acid is made to be 0.6 mass % or more, the improvement of the silver adhesion strength is saturated, and the gel time becomes longer, and thus, the productivity is reduced. The blending amount of 3-nitrobenzoic acid is preferably 0.6 mass % or less, further 0.5 mass % or less, and preferably 0.4 mass % or less. As is Example 2, the silver adhesion strength can be improved even when the blending amount 3-nitrobenzoic acid is as slight as 0.001 mass %.

Furthermore, when the blending amount of 3-nitrobenzoic acid is too large, a glass transition point of a cured product obtained by curing an encapsulating resin composition is reduced, thus heat resistance is reduced. The blending amount of 3-nitrobenzoic acid is preferably 2 mass % or less, and more preferably 1 mass % or less.

From the results of Examples 1 to 9 shown in Table 1, when 3-nitrobenzoic acid, which is one of aromatic monocarboxylic acids having one or more electron-withdrawing functional groups selected from a nitro group and a cyano group, is included in a range of 0.01 parts by mass (Example 2) to 6 parts by mass (Example 5), inclusive, with respect to 1000 parts by mass of the whole amount of the encapsulating resin composition, excellent adhesion, reflow resistance, and reliability are obtained.

From the results of Examples 10 to 12 shown in Table 1, also in each case where 2-methyl-3-nitrobenzoic acid (Example 10) or 3-cyanobenzoic acid (Example 11) is used as the aromatic monocarboxylic acid having one ore more electron-withdrawing functional groups selected from a nitro group and a cyano group, similar to the case where 3-nitrobenzoic acid is used (Example 12), excellent adhesion, reflow resistance, and reliability are obtained. Although not shown in Table 1, similar to the case where 3-nitrobenzoic acid is included, when 2-methyl-3-nitrobenzoic acid and 3-cyanobenzoic acid are included in a range from 0.01 parts by mass to 6 parts by mass with respect to 1000 parts by mass of the total amount of the encapsulating resin composition, excellent adhesion, reflow resistance, and reliability are obtained.

TABLE 2

| Composition (part by mass) | | Comparative Example | | | | | | | | | | | | | | | | |
|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 | 17 |
| | Filler | 874 | 874 | 874 | 874 | 847 | 874 | 877 | 850 | 877 | 877 | 877 | 877 | 877 | 877 | 877 | 877 | 391 |
| | Silane coupling agent A | 5 | 5 | 5 | 5 | 5 | 5 | 5 | 5 | 5 | 5 | 5 | 5 | 5 | 5 | 5 | 5 | — |
| | Silane coupling agent B | — | — | — | — | — | — | — | — | — | — | — | — | — | — | — | — | 2.5 |
| | Epoxy resin A | 64 | 64 | 64 | 64 | — | 106 | 60 | 70 | 64 | 30 | 63 | 64 | 63 | 62.9 | 63 | 64 | — |
| | Epoxy resin B | — | — | — | — | 90 | — | — | — | — | — | — | — | — | — | — | — | — |
| | Epoxy resin C | — | — | — | — | — | — | — | — | — | 30 | — | — | — | — | — | — | 50 |
| | Epoxy resin D (HP4032D) | — | — | — | — | — | — | — | — | — | — | — | — | — | — | — | — | 180 |
| | Phenol novolac resin | — | — | — | — | 48 | — | — | — | — | — | — | — | — | — | — | — | 270 |
| | Phenol aralkyl resin | 21 | 21 | 21 | 21 | — | — | 20 | — | 21 | 20 | 21 | 21 | 21 | 21 | 21 | 21 | — |
| | Biphenyl aralkyl resin | 26 | 26 | 26 | 26 | — | — | 25 | — | 26 | 30 | 26 | 26 | 26 | 26 | 26 | 26 | — |
| | Cyanate ester resin | — | — | — | — | — | — | — | 68 | — | — | — | — | — | — | — | — | — |
| | Acrylic acid ester | — | — | — | — | — | — | — | — | — | — | — | — | — | — | — | — | 70 |
| | Imidazole | — | — | — | — | — | 5 | — | — | — | — | — | — | — | — | — | — | — |
| | Mold release agent | 4 | 4 | 4 | 4 | 4 | 4 | 4 | 4 | 4 | 4 | 4 | 4 | 4 | 4 | 4 | 4 | 4 |
| | Ion trapping agent A | 3 | 3 | 3 | 3 | 3 | 3 | 3 | 3 | 3 | 3 | 3 | 3 | 3 | 3 | 3 | 3 | 3 |
| | Ion trapping agent B | — | — | — | — | — | — | — | — | — | — | — | — | — | — | — | — | — |
| | Ion trapping agent C | — | — | — | — | — | — | — | — | — | — | — | — | — | — | — | — | — |
| | Curing accelerator (TPP) | 1 | 1 | 1 | 1 | 1 | 1 | 1 | 1 | 1 | 1 | 1 | 1 | 1 | 1 | 1 | 1 | 1 |
| | Curing accelerator (DBU) | — | — | — | — | — | — | — | — | — | — | — | — | — | — | — | — | — |
| | Pigment | 2 | 2 | 2 | 2 | 2 | 2 | 2 | 2 | 2 | 2 | 2 | 2 | 2 | 2 | 2 | 2 | 2 |
| | 3-nitrobenzoic acid | — | — | — | — | — | — | — | — | — | — | — | — | — | — | — | — | 30 |
| | Nitrobenzene | — | — | — | — | — | — | — | — | — | — | 0.5 | — | — | — | — | — | — |
| | Benzoic acid | — | — | — | — | — | — | — | — | — | — | 0.5 | — | — | — | — | — | — |
| | 2-methyl-3-nitrobenzoic acid | — | — | — | — | — | — | — | — | — | — | — | — | — | — | — | — | — |
| | 3-cyanobenzoic acid | — | — | — | — | — | — | 6 | — | — | — | — | — | — | — | — | — | — |
| | 3-nitroisophthalic acid | 0.1 | — | — | — | — | — | — | — | — | — | — | — | — | — | — | — | — |
| | 4-nitroisophthalic acid | — | 0.1 | — | — | — | — | — | — | — | — | — | — | — | — | — | — | — |
| | 5-nitroisophthalic acid | — | — | — | 0.1 | — | — | — | — | — | — | — | — | — | — | — | — | — |
| | Nitroterephthalic acid | — | — | 0.1 | — | — | — | — | — | — | — | — | — | — | — | — | — | — |
| | Salicylic acid | — | — | — | — | — | — | — | — | — | — | — | 0.1 | 0.5 | 0.5 | — | — | — |
| | 4,4′-dithiomorpholine | — | — | — | — | — | — | — | — | — | — | — | — | — | — | — | 0.9 | — |
| Evaluation | Total | 1000.1 | 1000.1 | 1000 | 1000.1 | 1000 | 1000 | 1003 | 1003 | 1003 | 1002 | 1003 | 1003 | 1003 | 1003 | 1003 | 1004 | 1003 |
| | Sulfur content in terms of SO3 (mass %) | 0.02 | 0.02 | 0.02 | 0.02 | 0.02 | 0.02 | 0.02 | 0.02 | 0.02 | 0.02 | 0.02 | 0.027 | 0.05 | 0.05 | 0.23 | 0.23 | 0.23 |
| | Gel time (sec) | 37 | 39 | 38 | 30 | 28 | 45 | 49 | 28 | 29 | 40 | 31 | 31 | 38 | 30 | 30 | 70 | 20 |
| | Curability (N/m) | 0.45 | 0.42 | 0.42 | 0.41 | 2.2 | 3.6 | 0.38 | 4.1 | 0.89 | 0.82 | 0.86 | 0.85 | 0.67 | 0.84 | 0.85 | 0.1 | 0.2 |
| | Pulverizability | Good | Good | Good | Good | Good | Good | Good | Good | Good | Good | Good | Good | Good | Good | Good | Good | Poor |
| | Shore D hardness | 76 | 75 | 75 | 73 | 83 | 84 | 70 | 84 | 81 | 80 | 80 | 79 | 77 | 79 | 79 | 68 | — |
| | Ag-adhesion (MPa) | 31 | 30 | 32 | 27 | 17 | 25 | 33 | 14 | 20 | 23 | 19 | 30 | 34 | 35 | 41 | 18 | — |
| | Pd-adhesion (MPa) | 20 | 20 | 22 | 19 | 13 | 16 | 21 | 12 | 15 | 15 | 15 | 20 | 21 | 22 | 25 | 14 | — |
| | Ni-adhesion (MPa) | 15 | 16 | 18 | 16 | 10 | 13 | 19 | 8 | 13 | 16 | 13 | 16 | 16 | 18 | 18 | 15 | — |
| | Reflow resistance | Good | Good | Good | Good | Poor | Poor | Good | Poor | Poor | Poor | Poor | Good | Good | Good | Good | Poor | — |
| | Reliability evaluation A (hour) | Good | Good | Good | Good | Good | Good | Good | Good | Good | Good | Good | Good | Good | Good | Good | Good | — |
| | Reliability evaluation B (hour) | 336 | 336 | 336 | 168 | 840 | 504 | 168 | 168 | 840 | 672 | 504 | 168 | 168 | 336 | 336 | 336 | — |

From the results of Comparative Examples 1 to 4 shown in Table 2, in cases where 3-nitroisophthalic acid (Comparative Example 1), 4-nitroisophthalic acid (Comparative Example 2), nitroterephthalic acid (Comparative Example 3), and 5-nitroisophthalic acid (Comparative Example 4) are used, good results (Good) are obtained in reliability evaluation A, but problem arises in reliability evaluation B. When semiconductor is subjected to the UHAST, time at which an electrical resistance value becomes 1.5 times as large as the initial value is 336 hours in Comparative Examples 1 to 3, and 168 hours in Comparative Example 4.

As shown in Comparative Examples 5 and 6 shown in Table 2, when aromatic monocarboxylic acid having one or more electron-withdrawing functional groups selected from a nitro group and a cyano group (for example, 3-nitrobenzoic acid shown in Examples 1 to 9 and Example 12, 2-methyl-3-nitrobenzoic acid shown in Example 10, and 3-cyanobenzoic acid shown in Example 11) is not included, Ag adhesion, Pd adhesion, and Ni adhesion are deteriorated. As shown in Comparative Examples 5 and 6, aromatic monocarboxylic acid having one or more electron-withdrawing functional groups selected from a nitro group and a cyano group is not included, the reflow resistance is reduced.

As shown in Comparative Example 7 shown in Table 2, even when the content of 3-notroisophthalic acid is increased, a problem remains in the reliability evaluation B. As in Comparative Example 8 shown in Table 2, even when cyanate ester resin is used without addition of 3-nitrobenzoic acid, a problem remains in the adhesion, the reflow resistance, and the reliability. From Comparative Example 9, when 3-nitrobenzoic acid is not added, the adhesion is reduced, and the reflow resistance is not also improved. From Comparative Example 10 shown in Table 2, even if epoxy resin B (YX4000) is used, when 3-nitrobenzoic acid is not included, the adhesion is not increased, and a problem remains in the evaluation of the reflow resistance. From Comparative Example 11 shown in Table 2, even when nitrobenzene and benzoic acid are used, an effect as in 3-nitrobenzoic acid (for example, Examples 1 to 9) is not obtained. From Comparative Examples 12 to 14 shown in Table 2, in the case where 4.4'-dithiomorpholine is contained, even if 3-nitrobenzoic acid is contained, a problem remains in the reliability evaluations A and B. From Comparative Example 15 shown in Table 2, when silane coupling agent A (mercaptosilane KBM803 including sulfur) is used, the adhesion and the reflow resistance are improved because sulfur is included, but a problem remains in the reliability evaluations A and B. From Comparative Example 16 shown in Table 2, when salicylic acid is added instead of 3-nitrobenzoic acid or the like, a problem arises in the evaluation of reflow resistance, the reliability evaluations A and B. Furthermore, as shown in Comparative Example 17 shown in Table 2, when acrylic acid ester is added, the pulverizability is evaluated as "Poor." Comparative Example 17 generates a soft rubber-like elastic body whose elastic modulus is too low to be pulverized at 25° C. In Comparative Example 17 in which the soft rubber-like elastic body is generated, the adhesion and other evaluations cannot be evaluated. Acrylic acid ester in Comparative Example 17 is SG-70L (a solvent-removed product having a weight-average molecular weight of 900,000) manufactured by Nagase ChemteX Corporation.

Table 3 shows an example of evaluation results of pH in each of the encapsulating resin compositions. Examples 1 to 5 shown in Table 3 are the same as Examples 1 to 5 shown in Table 1, except that Table 3 shows measurement results of pH of the encapsulating resin composition in Examples 1 to 5.

TABLE 3

| | | Examples | | | | | Comparative Examples | | |
|---|---|---|---|---|---|---|---|---|---|
| | | 1 | 2 | 3 | 4 | 5 | 18 | 19 | 20 |
| Composition (part by mass) | Filler | 874 | 874 | 874 | 874 | 874 | 877 | 874 | 874 |
| | Silane coupling agent A | — | — | — | — | — | — | — | — |
| | Silane coupling agent B | 5 | 5 | 5 | 5 | 5 | 5 | 5 | 5 |
| | Epoxy resin A | 64 | 64 | 63 | 61 | 60 | 64 | 64 | 64 |
| | Epoxy resin B | — | — | — | — | — | — | — | — |
| | Epoxy resin C | — | — | — | — | — | — | — | — |
| | Phenol novolac resin | — | — | — | — | — | — | — | — |
| | Phenol aralkyl resin | 21 | 21 | 21 | 21 | 20 | 21 | 21 | 21 |
| | Biphenyl aralkyl resin | 26 | 26 | 26 | 26 | 25 | 26 | 26 | 26 |
| | Cyanate ester resin | — | — | — | — | — | — | — | — |
| | Imidazole | — | — | — | — | — | — | — | — |
| | Mold release agent | 4 | 4 | 4 | 4 | 4 | 4 | 4 | 4 |
| | Ion trapping agent A | 3 | 3 | 3 | 3 | 3 | — | — | — |
| | Ion trapping agent B | — | — | — | — | — | — | 3 | — |
| | Ion trapping agent C | — | — | — | — | — | — | — | 3 |
| | Curing accelerator (TPP) | 1 | 1 | 1 | 1 | 1 | 1 | 1 | 1 |
| | Curing accelerator (DBU) | — | — | — | — | — | — | — | — |
| | Pigment | 2 | 2 | 2 | 2 | 2 | 2 | 2 | 2 |
| | 3-nitrobenzoic acid | 0.1 | 0.01 | 1 | 3 | 6 | 0.1 | 0.1 | 0.1 |
| Evaluation | Total | 1000.1 | 1000.01 | 1000 | 1000 | 1000 | 1000.1 | 1000.1 | 1000 |
| | Sulfur content in terms of SO3 (mass %) | 0.02 | 0.02 | 0.02 | 0.02 | 0.02 | 0.02 | 0.02 | 0.02 |
| | Gel time (sec) | 30 | 30 | 32 | 33 | 45 | 30 | 30 | 30 |
| | Curability (N/m) | 0.88 | 0.89 | 0.85 | 0.86 | 0.53 | 0.88 | 0.67 | 0.84 |
| | pH | 6.5 | 6.5 | 6.5 | 6.5 | 6.5 | 4.5 | 8 | 3.5 |
| | Shore D hardness | 80 | 81 | 80 | 80 | 76 | 80 | 80 | 80 |
| | Ag-adhesion (MPa) | 32 | 27 | 33 | 34 | 34 | 29 | 28 | 26 |
| | Pd-adhesion (MPa) | 22 | 20 | 22 | 23 | 23 | 20 | 20 | 18 |
| | Ni-adhesion (MPa) | 18 | 16 | 18 | 19 | 20 | 16 | 16 | 15 |
| | Reflow resistance | Good | Good | Good | Good | Good | Good | Good | Good |
| | Reliability evaluation A (hour) | Good | Good | Good | Good | Good | Good | Good | 750 |
| | Reliability evaluation B (hour) | Good | Good | Good | Good | Good | 336 | 500 | 336 |

From the results shown in Table 3, in each of Examples 1 to 5, pH of the encapsulating resin composition after curing is about 6.5. Also in each of the other Examples (for example, Examples 6 to 15) not shown in Table 3, pH of the encapsulating resin composition after curing is in a range from 5.0 to 7.5. On the other hand, pH of Comparative Example 18 is 4.5, that of Comparative Example 19 is 8.0, and that of Comparative Example 20 is 3.5. All the pH values of Comparative Examples are out of the range from 5.0 to 7.5. As a result, problems of the reliability evaluation B occur.

Results shown in Table 3 demonstrate that when the encapsulating resin composition includes an aromatic monocarboxylic acid, even though the content thereof is extremely small, the moisture-resistance reliability and high-temperature reliability of wire other than gold wire can be enhanced.

When an aromatic monocarboxylic acid having a hydroxyl group is used, the hydroxyl group reacts with an epoxy group (or a glycidyl group) in epoxy resin, and the aromatic monocarboxylic acid is taken into a resin matrix. Therefore, the aromatic monocarboxylic acid having the hydroxyl group is taken into the epoxy resin as a matrix even though a carboxyl group thereof attempts to react with metal. As a result, the aromatic monocarboxylic acid having a hydroxyl group does not function on the interface part with metal. Furthermore, the aromatic monocarboxylic acid having a hydroxyl group does not cover a metal surface because of effect of steric hindrance or the like.

As described in this exemplary embodiment, it is preferable that an aromatic monocarboxylic acid having no hydroxyl group is included as a component of an encapsulating resin composition. The aromatic monocarboxylic acid having no hydroxyl group, even with the content of as small as 0.6 mass % or less, and further 0.1 mass % or less with respect to the whole amount of the encapsulating resin composition, expresses an effect of enhancing the adhesion strength between the encapsulating resin composition and metal of lead frame 53 and the like. The reason why the adhesion strength is improved is because the aromatic monocarboxylic acid having no hydroxyl group, which has been added to the encapsulating resin composition, does not react with an epoxy group (or a glycidyl group) in epoxy resin, which has been added to the encapsulating resin composition, so that the aromatic monocarboxylic acid is not taken into the matrix of the epoxy resin. As in this exemplary embodiment, the aromatic monocarboxylic acid having no hydroxyl group does not react with epoxy resin, and the reactivity is enhanced between the carboxyl group of the aromatic monocarboxylic acid and metal of lead frame 53 or the like. On the other hand, the aromatic carboxylic acid having a hydroxyl group has a problem that the hydroxyl group and the epoxy group (or the glycidyl group) react with each other, and the aromatic carboxylic acid is taken into a three-dimensional matrix made of epoxy resin. There is a problem that the aromatic carboxylic acid is taken into the three-dimensional matrix, making it difficult for the aromatic carboxylic acid to move to the metal surface of, for example, lead frame 53.

The encapsulating resin composition of this exemplary embodiment can be applied to NCF (Non Conductive Film. NCF means film material for under-fill in flip mounting). When the encapsulating resin composition of this exemplary embodiment is applied to NCF, it is necessary to further add flux material to this encapsulating resin composition. Note here that when the encapsulating resin composition in accordance with this exemplary embodiment is used for NCF, or when flux material is added to the encapsulating resin composition, it becomes difficult to carry out transfer molding. Furthermore, in a case of a film-like encapsulating resin composition (NCF), a problem arise that the elastic modulus at room temperature (25° C.) is too low to be molded into a granular or tablet shape. This problem occurs in a pulverization process using a pulverizer when NCF is formed of the encapsulating resin composition of this exemplary embodiment. When the NCF including the encapsulating resin composition of this exemplary embodiment is pulverized, a part of the encapsulating resin composition adheres or is attached to the inside of the pulverizer, thus deteriorating the pulverization workability.

Note here that when carboxylic acid is added to the encapsulating resin composition, a flux function is expressed. In order to allow the encapsulating resin composition to express a flux function, pKa needs to be at least 3.5 or more. However, in order to enhance the adhesion of the encapsulating resin composition to metal material such as copper and silver, pKa is preferably 3.4 or less. Therefore, the above-mentioned excellent effect cannot be achieved only by addition of carboxylic acid to the encapsulating resin composition of this exemplary embodiment.

Even when aromatic polycarboxylic acid ester is used as the additive agent, instead of the aromatic monocarboxylic acid, it cannot achieve such an excellent effect as that in aromatic monocarboxylic acid because aromatic polycarboxylic acid ester is an ester and is utterly different from aromatic monocarboxylic acid in this exemplary embodiment.

It is also possible to add a salt of carboxylic acid into the encapsulating resin composition. When the salt of carboxylic acid is added, the salt expresses the flux activity at the time of soldering. However, in a case where the salt of carboxylic acid is added to the encapsulating resin composition, there is a problem that the salt of carboxylic acid expresses delayed curing property to curing of amine of epoxy. In experiments carried out by the present inventors, the salt of carboxylic acid added does not express the effect of improving the adhesion of the encapsulating resin composition to the surface of copper or silver.

In a case where the aromatic carboxylic acid is contained in the encapsulating resin composition at a content more than 5 mass % with respect to the whole encapsulating resin composition, a reaction of a curing accelerator contained in the encapsulating resin composition may be suppressed. One of the reasons why the reaction is suppressed is because the aromatic carboxylic acid that has added to the encapsulating resin composition functions as a catalyst for a reaction with epoxy. That is to say, this aromatic carboxylic acid covers the surface of the imidazole compound that reacts with epoxy. As a result, an inclusion body (or a clathrate, an inclusion compound) is formed, thus suppressing the reaction between epoxy resin and an imidazole compound.

In a case where aromatic polycarboxylic acid is added to the encapsulating resin composition, it is not possible to achieve an excellent effect as mentioned above in the exemplary embodiment. The aromatic polycarboxylic acid releases two or more protons per molecule, so that the protons deactivate the basic catalyst.

What is claimed is:
1. An encapsulating resin composition comprising:
a thermosetting resin component;
a curing accelerator;
an inorganic filler;
an ion trapping agent; and an aromatic monocarboxylic acid having an aromatic ring, one carboxyl group directly bonded to the aromatic ring, and one or more electron-withdrawing functional groups selected from a nitro group and a cyano group and directly bonded to the aromatic ring, wherein:

the encapsulating resin composition is solid at 25° C., and has a sulfur content, measured by X-ray fluorescence analysis, of 0.025 mass % or less in terms of $SO_3$, the ion trapping agent includes at least one of a hydrotalcite ion trapping agent and an aluminum-magnesium ion trapping agent, and with respect to a whole amount of the encapsulating resin composition, a content of the aromatic monocarboxylic acid is in a range from 0.001 mass % to 0.6 mass %, inclusive, and a content of the ion trapping agent is in a range from 0.05 mass % to 0.6 mass %, inclusive.

2. The encapsulating resin composition according to claim 1,
wherein the thermosetting resin component contains at least one component selected from the group consisting of epoxy resin, cyanate ester resin, benzoxazine resin, and maleimide resin.

3. The encapsulating resin composition according to claim 1,
wherein the thermosetting resin component contains epoxy resin, and at least one component of a phenol compound, benzoxazine resin, acid anhydride, and an imidazole compound.

4. The encapsulating resin composition according to claim 1,
wherein the thermosetting resin component is free from a nitro group.

5. The encapsulating resin composition according to claim 1,
wherein the ion trapping agent contains a carbonate ion or a hydroxide ion.

6. The encapsulating resin composition according to claim 1,
wherein a pH value of the encapsulation resin composition is in a range from 5.0 to 7.5, inclusive.

7. A method for manufacturing a semiconductor device, the method comprising:
preparing the encapsulating resin composition as defined in claim 1; and
molding the encapsulating resin composition by a pressure-molding process to produce an encapsulation resin encapsulating a semiconductor element,
wherein the semiconductor element is mounted on a lead frame, and electrically coupled to the lead frame by a wire.

8. The method for manufacturing a semiconductor device according to claim 7,
wherein when the encapsulating resin composition is molded by a pressure-molding process, a molding pressure is 3.0 MPa or more and a molding temperature is 120° C. or more.

9. The encapsulating resin composition according to claim 1, wherein the thermosetting resin component contains epoxy resin.

10. The encapsulating resin composition according to claim 9, wherein a content of the epoxy resin is in a range from 5 mass % to 35 mass %, inclusive, with respect to a whole amount of the encapsulating resin composition.

11. The encapsulating resin composition according to claim 9, wherein the epoxy resin contains at least one of biphenyl aralkyl-type epoxy resin and biphenyl-type epoxy resin.

12. The encapsulating resin composition according to claim 1, wherein a content of the inorganic filler is in a range from 60 mass % to 93 mass %, inclusive, with respect to a whole amount of the encapsulating resin composition.

13. The encapsulating resin composition according to claim 1,
wherein the aromatic monocarboxylic acid includes at least one selected from the group consisting of 2-nitrobenzoic acid, 3-nitrobenzoic acid, 4-nitrobenzoic acid, 3-methyl-4-nitrobenzoic acid, 2-methyl-3-nitrobenzoic acid, 4-methyl-3-nitrobenzoic acid, 2-methyl-6-nitrobenzoic acid, 3-methyl-2-nitrobenzoic acid, 2-methyl-5-nitrobenzoic acid, 5-methyl-2-nitrobenzoic acid, 2-cyanobenzoic acid, 3-cyanobenzoic acid, 4-cyanobenzoic acid, 4-hydroxy-3-nitrobenzoic acid, 5-hydroxy-2-nitrobenzoic acid, 3-hydroxy-4-nitrobenzoic acid, 3-hydroxy-2-nitrobenzoic acid, 2-hydroxy-4-nitrobenzoic acid, and 2-hydroxy-5-nitrobenzoic acid.

14. The encapsulating resin composition according to claim 1,
wherein the aromatic monocarboxylic acid includes at least one selected from the group consisting of 3-nitrobenzoic acid, 2-methyl-3-nitrobenzoic acid, and 3-cyanobenzoic acid.

15. A semiconductor device comprising:
a lead frame;
a semiconductor element mounted on the lead frame; and
a wire electrically connecting the semiconductor element to the lead frame;
wherein the semiconductor element is encapsulated by the encapsulating resin composition as defined in claim 1.

16. The semiconductor device according to claim 15, wherein the lead frame has a plated layer including at least one component of silver, nickel, and palladium.

17. The semiconductor device according to claim 15, wherein the wire includes at least one of copper and silver.

18. The semiconductor device according to claim 15, wherein pH of the encapsulating resin composition is in a range from 5.0 to 7.5, inclusive.

* * * * *